US012647074B2

(12) United States Patent
Laufer et al.

(10) Patent No.: US 12,647,074 B2
(45) Date of Patent: Jun. 2, 2026

(54) ISOLATION ASSEMBLIES FOR ENHANCED OSCILLATOR STABILITY

(71) Applicant: MELLANOX TECHNOLOGIES, LTD., Yokneam (IL)

(72) Inventors: Nir Laufer, Zoran (IL); Dotan David Levi, Kiryat Motzkin (IL); Boaz Atias, Ma'ale Adumim (IL); Elad Mentovich, Tel Aviv (IL)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 0 days.

(21) Appl. No.: 18/802,492

(22) Filed: Aug. 13, 2024

(65) Prior Publication Data

US 2026/0051849 A1     Feb. 19, 2026

(51) Int. Cl.
*H03B 5/30*     (2006.01)
*H03B 5/04*     (2006.01)
*H03L 7/099*     (2006.01)
*H05K 5/02*     (2006.01)

(52) U.S. Cl.
CPC ................. *H03B 5/30* (2013.01); *H03B 5/04* (2013.01); *H03L 7/099* (2013.01); *H05K 5/0217* (2013.01)

(58) Field of Classification Search
CPC ........................................................ H03B 5/30
USPC ............................................................ 331/68
See application file for complete search history.

(56) References Cited

U.S. PATENT DOCUMENTS 4,490,773 A * 12/1984 Moffatt .................... H01G 5/16
                                                                                361/283.4
2003/0001682 A1* 1/2003 Biernacki ............ H03H 9/1014
                                                                                331/68

* cited by examiner

*Primary Examiner* — Joseph Chang
(74) *Attorney, Agent, or Firm* — Hogan Lovells US LLP

(57) ABSTRACT

Approaches presented herein provide for the isolation of electronic components, such as oscillators, that may be sensitive to environmental conditions such as temperature. In at least one embodiment, an isolation assembly can be provided that includes a sealed housing for preventing ambient air from reaching an oscillator operating within an inner chamber of the sealed housing. The walls of the inner chamber can have a layer of low-emissivity blocking material that can reduce the amount of heat transferred to the oscillator due to radiation. The inner chamber can also be connected to a vacuum through an air valve that allows the pressure in the chamber to be reduced, to reduce an amount of heat transfer due to conduction.

20 Claims, 16 Drawing Sheets

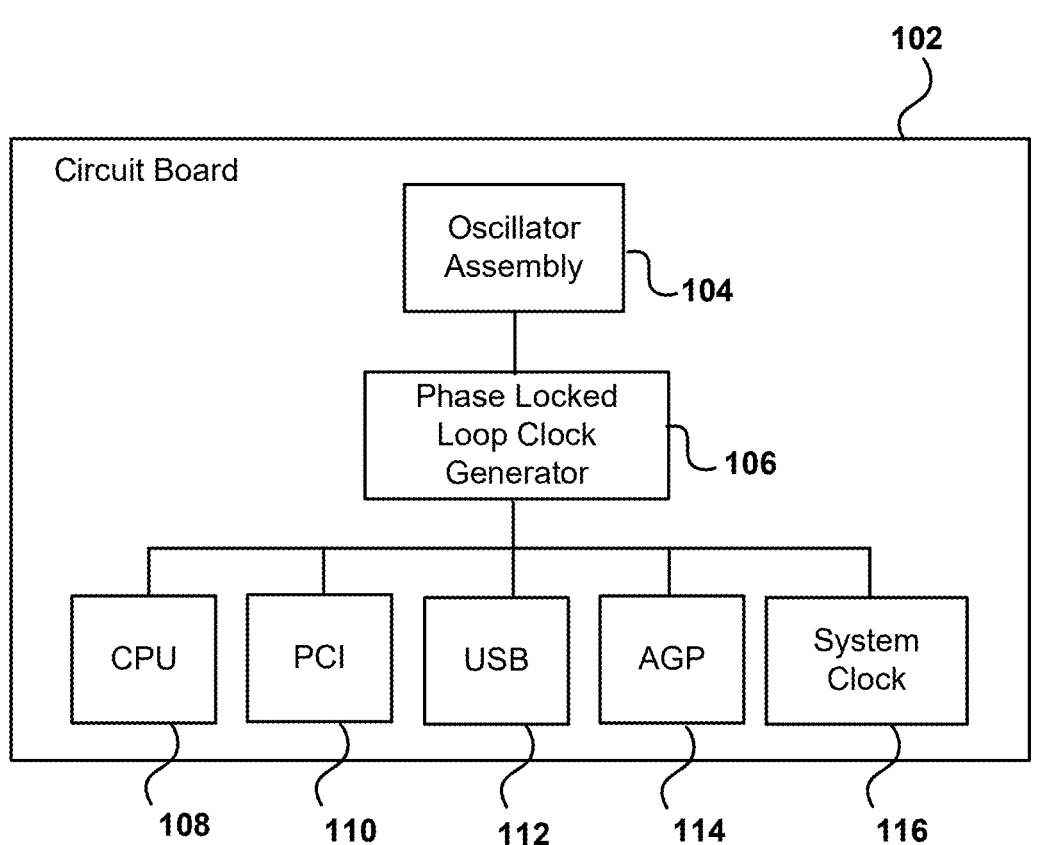
FIG. 1

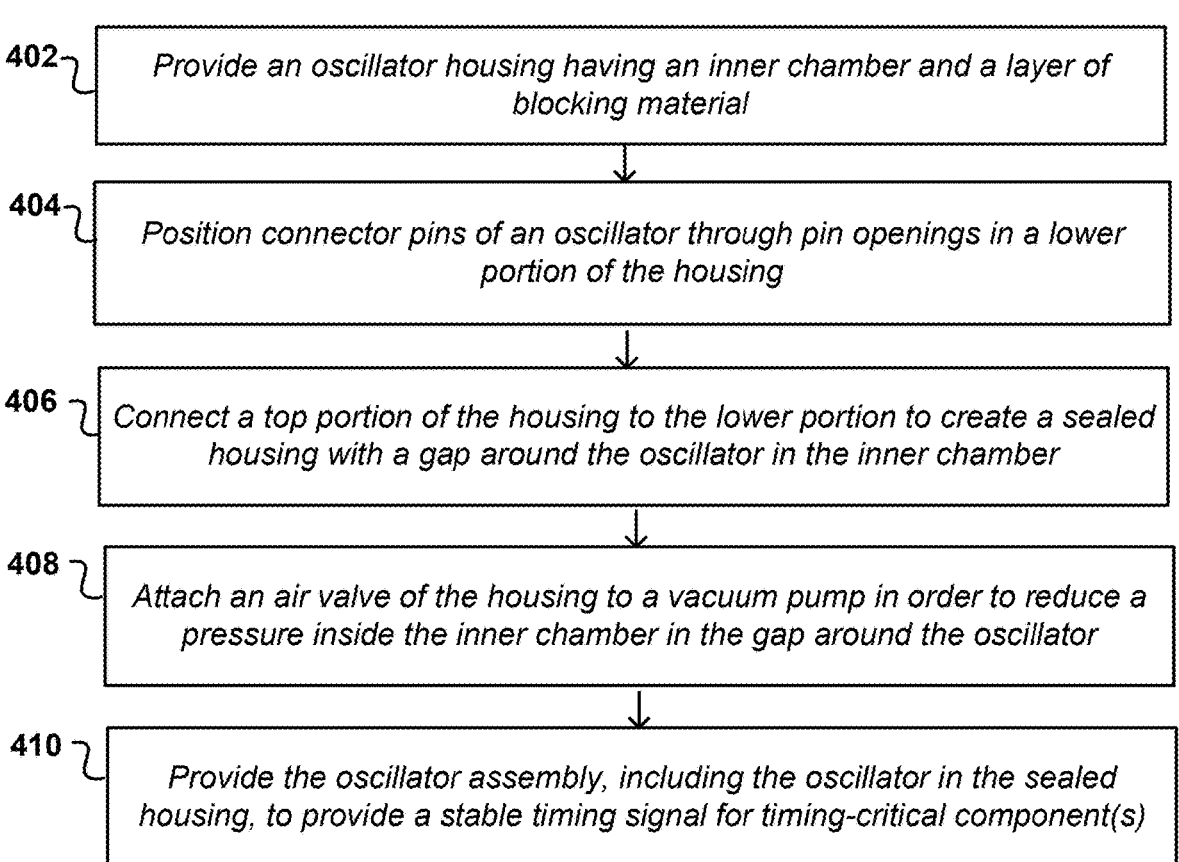

402 — *Provide an oscillator housing having an inner chamber and a layer of blocking material*

404 — *Position connector pins of an oscillator through pin openings in a lower portion of the housing*

406 — *Connect a top portion of the housing to the lower portion to create a sealed housing with a gap around the oscillator in the inner chamber*

408 — *Attach an air valve of the housing to a vacuum pump in order to reduce a pressure inside the inner chamber in the gap around the oscillator*

410 — *Provide the oscillator assembly, including the oscillator in the sealed housing, to provide a stable timing signal for timing-critical component(s)*

FIG. 4

Figure 5:
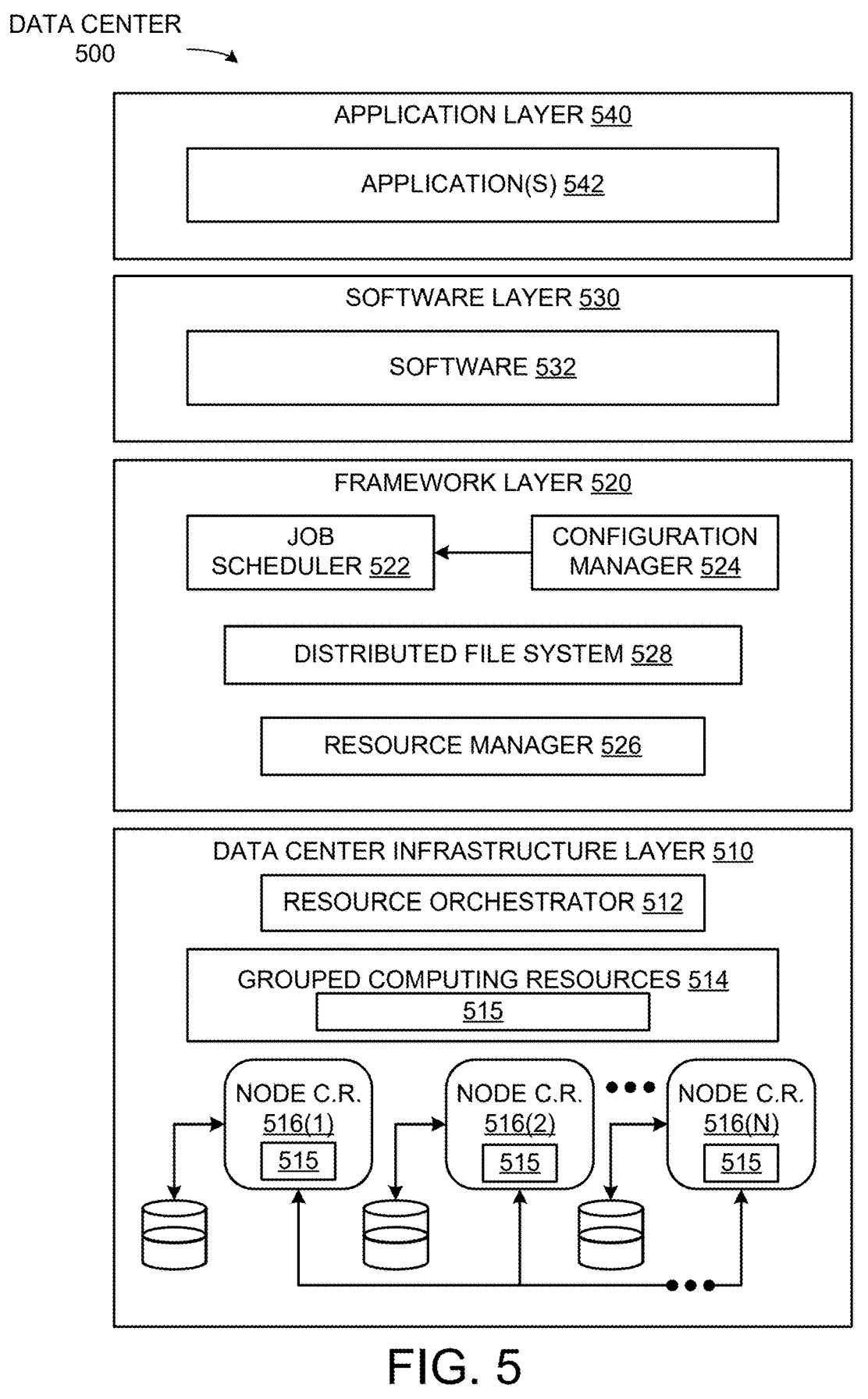

DATA CENTER
500

APPLICATION LAYER 540

APPLICATION(S) 542

SOFTWARE LAYER 530

SOFTWARE 532

FRAMEWORK LAYER 520

JOB SCHEDULER 522 ← CONFIGURATION MANAGER 524

DISTRIBUTED FILE SYSTEM 528

RESOURCE MANAGER 526

DATA CENTER INFRASTRUCTURE LAYER 510

RESOURCE ORCHESTRATOR 512

GROUPED COMPUTING RESOURCES 514

515

NODE C.R. 516(1)

515

NODE C.R. 516(2)

515

• • •

NODE C.R. 516(N)

PROCESSOR 602

515

EXECUTION UNIT 608

CACHE 604

REGISTER FILE 606

PACKED INSTRUCTION SET 609

PROCESSOR BUS 610

GRAPHICS/ VIDEO CARD 612

614

MEMORY CONTROLLER HUB 616

618

MEMORY 620

INSTRUCTION(S) 619

DATA 621

622

DATA STORAGE 624

WIRELESS TRANSCEIVER 626

FLASH BIOS 628

I/O CONTROLLER HUB 630

LEGACY I/O CONTROLLER 623

USER INPUT AND KEYBOARD INTERFACES 625

SERIAL EXPANSION PORT 627

AUDIO CONTROLLER 629

NETWORK CONTROLLER 634

600

COMPUTER
910

USB STICK 920

USB
INTERFACE
940

USB
INTERFACE
LOGIC 950

PROCESSING
UNIT
930

515

GRAPHICS
PROCESSOR
1110

VERTEX PROCESSOR
1105

515

FRAGMENT
PROCESSOR
1115A

515

FRAGMENT
PROCESSOR
1115C

515

FRAGMENT
PROCESSOR
1115N-1

515

FRAGMENT
PROCESSOR
1115B

515

FRAGMENT
PROCESSOR
1115D

515

FRAGMENT
PROCESSOR
1115N

515

MMU
1120A

MMU
1120B

CACHE
1125A

CACHE
1125B

INTERCONNECT
1130A

INTERCONNECT
1130B

GRAPHICS
PROCESSOR
1140
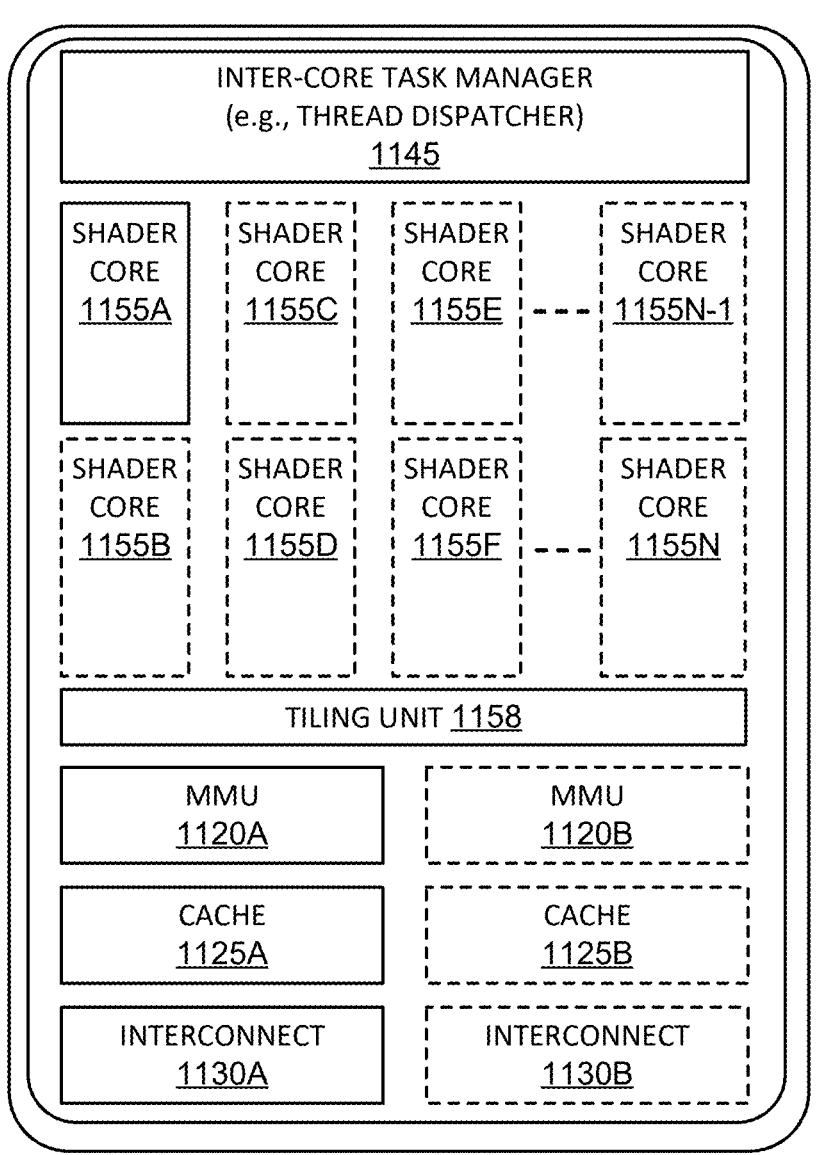
FIG. 11B

ISOLATION ASSEMBLIES FOR ENHANCED OSCILLATOR STABILITY

TECHNICAL FIELD

This disclosure relates to the operation of oscillators and similar electronic components that may be sensitive to fluctuations in environmental conditions, as well as approaches for improving or maintaining operational stability of such components.

BACKGROUND

In various electronic devices and systems, there is a need to have an accurate clock source that is able to be referenced by one or more components. The clock source can be used not only for timing of specific operations, but to allow for synchronization among various components, applications, or other such recipients that rely upon a common clock source. Various systems use an oscillator (e.g., a crystal oscillator) that is able to provide output at a specified frequency. As long as the frequency is stable, that output can be used as a reference timing signal. Unfortunately, the operational frequency of an oscillator can vary based on a number of factors. One of the key contributors to changes in the operational frequency of an oscillator is variation in temperature, to which a crystal oscillator can be highly sensitive. Temperature variation can occur in various electronic systems or devices, such as servers that include heat-generating components, which can generate different amounts of heat under different loads, as well as fans for directing the produced heat and other such sources. Further, heat can be transferred in a number of different ways, including conduction, convection, and radiation, which can further complicate any attempt to stabilize the operational frequency of an oscillator under a variety of operating conditions.

BRIEF DESCRIPTION OF THE DRAWINGS

Various embodiments in accordance with the present disclosure will be described with reference to the drawings, in which:

FIG. 1 illustrates an example computing device including an oscillator assembly, according to at least one embodiment;

FIG. 4 illustrates an example process that can be performed to isolate an oscillator, according to at least one embodiment.

FIG. 5 illustrates an example data center system, according to at least one embodiment;

FIGS. 11A, 11B illustrate exemplary integrated circuits and associated graphics processors, according to at least one embodiment;

DETAILED DESCRIPTION

Figure 2:
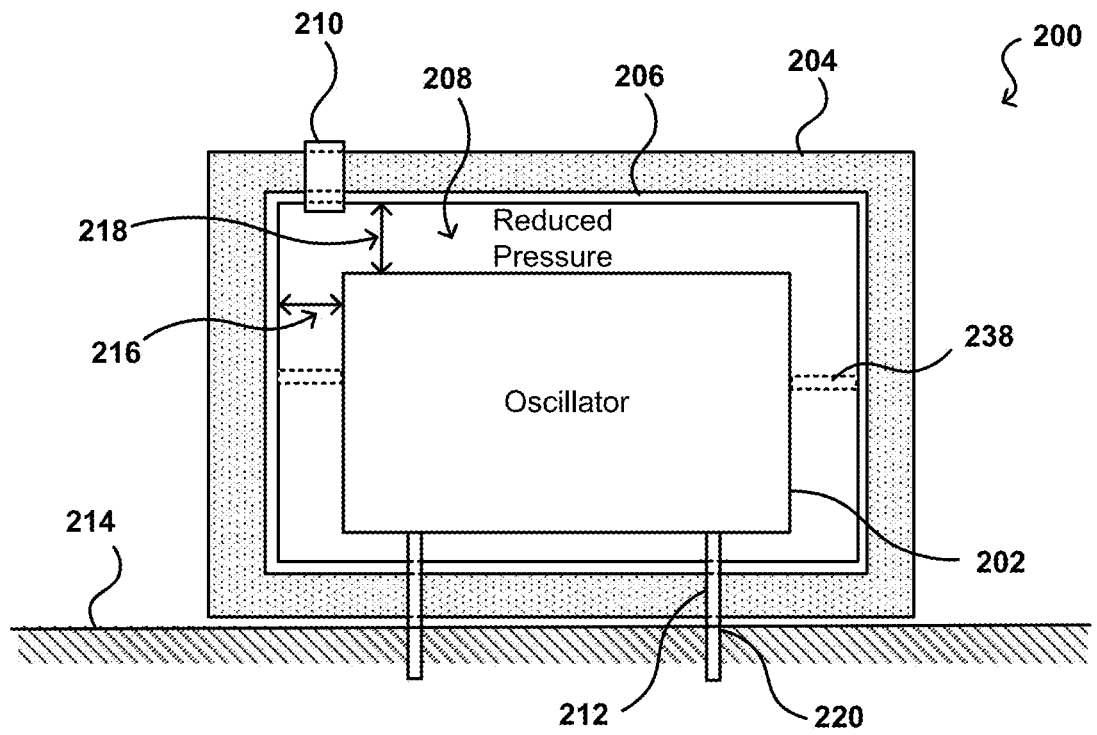
FIG. 2 illustrates a cross-sectional view of an example oscillator assembly, according to at least one embodiment.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

The systems and methods described herein may be used by, without limitation, non-autonomous vehicles or machines, semi-autonomous or autonomous vehicles or machines (e.g., in one or more advanced driver assistance systems (ADAS), one or more in-vehicle infotainment systems, one or more emergency vehicle detection systems), piloted and un-piloted robots or robotic platforms, warehouse vehicles, off-road vehicles, vehicles coupled to one or more trailers, flying vessels, boats, shuttles, emergency response vehicles, motorcycles, electric or motorized bicycles, aircraft, construction vehicles, trains, underwater craft, remotely operated vehicles such as drones, and/or other vehicle types. Further, the systems and methods described herein may be used for a variety of purposes, by way of example and without limitation, for machine control, machine locomotion, machine driving, synthetic data generation, generative AI, model training or updating, perception, augmented reality, virtual reality, mixed reality, robotics, security and surveillance, simulation and digital twinning, autonomous or semi-autonomous machine applications, deep learning, environment simulation, data center processing, conversational AI, light transport simulation (e.g., ray-tracing, path tracing, etc.), collaborative content creation for 3D assets, generative AI, cloud computing, and/or any other suitable applications.

Disclosed embodiments may be comprised in a variety of different systems such as automotive systems (e.g., an in-vehicle infotainment system for an autonomous or semi-autonomous machine, a perception system for an autonomous or semi-autonomous machine), systems implemented using a robot, aerial systems, medical systems, boating systems, smart area monitoring systems, systems for performing deep learning operations, systems for performing simulation operations, systems for performing digital twin operations, systems implemented using an edge device, systems incorporating one or more virtual machines (VMs), systems for performing synthetic data generation operations, systems implemented at least partially in a data center, systems for performing conversational AI operations, systems implementing one or more language models—such as large language models (LLMs), systems for performing generative AI operations (e.g., using one or more language models), systems for performing light transport simulation, systems for performing collaborative content creation for 3D assets, systems implemented at least partially using cloud computing resources, and/or other types of systems.

Approaches in accordance with various illustrative embodiments provide for improving and/or maintaining the operational stability of a temperature-sensitive electronic component, such as an oscillator to be used for timing-critical applications. As an example, the stability of an oscillator can be impacted by various factors, with temperature being a primary factor in many instances. The operating frequency of an oscillator can change due in part to fluctuations in heat due to conduction, convection, and/or radiation. In order to reduce such fluctuations in temperature, an oscillator can be placed in a sealed housing that provides significant isolation from external conditions. This can include placing the oscillator in an inner chamber of a sealed housing, which can help prevent temperature increases due to convection from heated air that might otherwise be directed to the oscillator. The sealed housing can be made of a material with low emissivity index, such as copper, positioned about an interior surface of the chamber in order to reduce temperature increases due primarily to radiation. The radiation blocking material can surround the oscillator in the chamber, but be separated from the oscillator to create a gap about the oscillator. A valve (or other mechanism) extending from the gap to an exterior of the housing can allow gas (e.g., air or other gas in the inner chamber) to be removed from the gap, in order to create a region of at least partial vacuum around the oscillator. The region of at least partial vacuum can help to prevent temperature increases due primarily to conduction. Such a device can help to largely isolate the oscillator from external conditions, which can improve the overall stability of the oscillator.

Variations of this and other such functionality can be used as well within the scope of the various embodiments as would be apparent to one of ordinary skill in the art in light of the teachings and suggestions contained herein.

FIG. 1 illustrates a diagrammatic view 100 of components of an example computing device 102 according to at least one embodiment. The components shown are not exhaustive, and there may be different selections of components in other embodiments. In this example computing device 102 (including at least a circuit board with computing components), there are various components that all leverage a common clock signal. This can include, for example, a central processing unit (CPU) 108, a peripheral component interface (PCI) device or connection 110, a universal serial bus (USB) device or connection 112, an accelerated graphics port (AGP) 114 as may be used to connect a graphics card, and a system clock 116. In order to allow for these devices to be synchronized, the devices can share a clock signal (or at least derivations of that clock signal) generated using a single timing component. In this example, an oscillator assembly 104 can be used that can output a reference timing signal at a specified frequency. Because the timing signal needs to be shared among various components, and because the components may want a reference timing signal that is synchronized but may be at different frequencies, a phase-locked loop (PLL) clock generator 106 can be used that is able to accept an input reference signal, and output synchronized timing signals at one or more frequencies. For example, a system clock 116 might run at the same frequency as the oscillator assembly 104, such as at 14.319 MHz, while a device such as a USB connection might use a reference clock signal at 48 MHz, among other such options.

While such an approach can allow for synchronized timing signals to be provided at one or more frequencies, difficulties can arise when the reference timing signal from the oscillator assembly 104 drifts to different operational frequencies. As mentioned, there may be various factors that can impact the operational frequency of an oscillator. This can include, for example, the age of the oscillator or variations in the environmental conditions in which the oscillator operates. While algorithmic approaches can be used to attempt to account for changes in operational frequency with age, which follow a gradual shift over time, many of these approaches have proven to be unreliable for changes in operational frequency due to temperature or other environmental conditions.

Accordingly, approaches in accordance with various embodiments can provide oscillator assemblies, housings, chambers, or other such devices or mechanisms that can shield an oscillator from at least some of these environmental conditions or fluctuations, and which can improve the operational stability of the oscillator. FIG. 2 illustrates a cross-sectional view 200 of an example oscillator assembly according to at least one embodiment. In this example, an oscillator 202 is illustrated to be connected to a circuit board 214, or other such circuit or operational substrate or device, using a set of connector pins 212. The connector pins 212 can perform various tasks, such as to transfer power and instructions to the oscillator, as well as to receive a timing signal from the oscillator at it operating frequency.

The oscillator 202 is illustrated to be enclosed in a sealed housing 204. As mentioned, heat can be transferred to the oscillator in at least three ways: through conduction, convection, and radiation. Accordingly, the sealed housing 204 of FIG. 2 is designed to prevent, or at least limit, the amount of heat transfer possible via each of these transfer mechanisms. As mentioned, the sealed housing 204 can have an inner chamber in which the oscillator 202 is positioned, such that the oscillator is at least partially isolated from varying ambient temperature external to the sealed housing. The sealed housing can be made of an appropriate blocking material, such as a plastic or polymer, aluminum, or metal that can prevent hot air from being incident on the oscillator 202, including heat that might be driven by a fan or other such mechanism. In at least one embodiment, the sealed housing 204 can be made from a material such as plastic that does not conduct heat as easily as other materials, such that fluctuations external to the sealed housing 204 will not as readily be passed to an internal surface, and thus the inner chamber, of the oscillator assembly. The sealed housing 204 can include a number of openings 216 (e.g., through holes) with an appropriate shape and size to allow the connector pins 212 of the oscillator 212 to pass through the wall of the sealed housing 204 so that the oscillator 202 can be connected to the circuit board 214, etc. The openings 216 in at least one embodiment can be shaped to tightly hold the pins so that the oscillator 202 is held in position in an inner chamber 208 of the sealed housing 204. In some embodiments the openings 220 might be larger in diameter than the connector pins 212, but have a sealing material positioned on an interior of the openings 220 in order to firmly grasp the connector pins 212 and prevent air (or other gas or particulates) from passing into the inner chamber 208. Various other options for allowing the connector pins 212 to pass through the wall of the sealed housing 204 while preventing air from passing into the inner chamber 208 can be used as well within the scope of various embodiments.

In some embodiments where the openings 220 are not sufficient to hold the oscillator 202 in place when the connector pins 212 are positioned in the openings 220, or where additional support is otherwise required, one or more posts 238, connectors, or other support mechanisms can be used to hold the oscillator in position in the inner chamber 208 of the sealed housing 204. These may include, for example, plastic or metal posts connected to the oscillator through mechanical clamping, adhesive, or a connector bolt, among other such options. Although two such posts 238 are illustrated, it should be understood that there may be other numbers and/or types of connectors or positioning mechanisms used in similar or alternative places in accordance with the various embodiments. As mentioned, there can be a gap 208 with reduced pressure between the oscillator 202 and the blocking layer 206, and the posts can be positioned at appropriate places within the gap 208. The length of the posts 238 can then depend in part on the distance or width of the gap at that point. The width of the gap 208 may be equal at all locations around the oscillator 202, or may vary at different points or on different sides. For example, there might be a first distance 216 determined for the sides of the oscillator 202 and a second distance 218 above the oscillator. The distances can be determined based at least in part upon a volume of reduced pressure that is to be provided through the gap. In at least one embodiment, the distance 216, 218 between an oscillator and a blocking layer 206 or wall of an inner chamber 208 can be in the range of about 1.0 mm to about 1.0 cm, or a range of about 2.0 mm to about 20 mm, but these distance values may vary based on other factors as well, such as size limitations. Further, in embodiments where at least partial vacuum (or reduced pressure) may not be used or required, a housing or cover may be used that is not sealed but that blocks a significant amount of hot air that would otherwise be incident on the oscillator 202, such as may be blown by a fan or other such element.

In at least one embodiment, a housing can be formed in two pieces that can then be connected together after the oscillator is in place and sealed to form a sealed housing. There can be a bottom portion, including the openings 216 through which the connector pins 212 can be passed, and then once the oscillator is in place a top portion can be connected. The interface between the two (or more) portions can have a seal, adhesive, or other such mechanism used to allow the housing to be sealed to prevent (or at least reduce) an amount of gas that can pass into, or out of, the sealed housing after scaling.

As mentioned, heat can also be transferred to the oscillator 202 through conduction or radiation. In order to mitigate heat transfer due to radiation, a blocking layer 206 can be positioned proximate an interior wall of the sealed housing 204. This can include, for example, a relatively thin (e.g., on the order of about 1 mm-2 mm in thickness) layer of a blocking material through which radiation is unable to pass, or through which an amount of radiation transmitted through the blocking material is less than the amount of radiation that was incident on the material. This can include, for example, a blocking material such as silver, copper, gold, or aluminum (or combinations or alloys thereof). For cost purposes, polished copper can be a reasonable choice for at least some embodiments. Other materials with low indexes of emissivity can be used as well. Further, although illustrated on an interior of the sealed housing 204, a blocking material layer could be positioned proximate an external surface of the sealed housing 204, or formed within the walls of the sealed housing 204. In other embodiments, the sealed housing 204 itself may be made from such a blocking material, although there can be heat transfer advantages to using a material such as plastic for the bulk housing in place of a highly heat conductive material such as copper. While illustrated to completely surround the oscillator 202 in the sealed enclosure (other than for the pin openings 216 and a vacuum valve 210), in some embodiments the blocking layer 206 may only be positioned on certain sides, or proximate certain portions, of the oscillator 202. For example, in at least one embodiment to save cost and reduce size the blocking layer may not be extended "under" the oscillator 202, between the oscillator 202 and the circuit board 214, if it is determined that an insufficient amount of radiation is likely to pass from that direction to warrant the use of a blocking layer in that location. At least a portion of any radiation that is incident on the exterior of the sealed housing 204 might pass through the walls of the sealed housing 204, but can be blocked (or at least reduced in intensity or other such metric) by the blocking layer 206 of blocking material such that little to no heat transmission occurs to the oscillator 202 or internal chamber 208 as a result of the radiation. It at least one embodiment, a low emissivity material can be applied as a coating to an interior wall of the sealed housing, where the thickness of the coating can be selected in order to control the amount of heat radiation reaching the oscillator 202.

In order to mitigate heat transfer due to conduction, the inner chamber 208 of the sealed housing 204 can be used to effectively create a chamber of lower or reduced pressure around the oscillator. A uni-directional vacuum value 210, pressure valve, air inlet, scalable channel, or other such mechanism, can be used to allow gas to be pulled from the inner chamber 208, through a double sided housing wall in at least one embodiment, in order to reduce the pressure within the chamber 208. This can be accomplished in at least one embodiment by connecting an air hose from a vacuum pump to the vacuum valve 210 and then pumping out gas until a desired amount of pressure (or other such metric) is achieved in the inner chamber. Although such a chamber may be referred to, or thought of, as a "vacuum" chamber, it should be understood that this chamber will typically have gas removed to reduce a pressure in the chamber to a pressure that is less than atmospheric (or other) pressure surrounding the sealed housing 204. This may include a pressure value near a target reduced pressure value or with a reduced pressure value range. While higher levels of vacuum may provide improved performance, those levels may also come with technical challenges in addition to the additional time and cost needed to achieve those higher levels. In at least one embodiment, any pressure less than about 14.7 PSIA (average atmospheric pressure) can achieve improved performance, with different target ranges for various applications, such as between about 5.0 and about 10.0 PSIA, or between about 3.0 and about 12.0 PSIA, among other such ranges. Certain embodiments may have a target value for reduced pressure in the chamber, such as 8.0 PSIA, 10.0 PSIA, and the like. Similarly, a region of at least partial pressure can be in the range of about 10e-1 to 10e-4 Bar. The region of at least partial vacuum (or reduced pressure) around the oscillator 202 in the chamber can help to reduce an amount of heat conduction to the oscillator due to external heat incident on the sealed housing 204 that might otherwise be transferred to the oscillator. In some embodiments the region of at least partial vacuum can completely surround the oscillator, other than at locations of pins, valves, connectors, or other such physical elements, while in other embodiments the at least partial vacuum may only be present on certain sides of the oscillator, or the width of the chamber may vary such that there may be larger regions of vacuum in certain locations, such as a larger gap "above" the oscillator 202, opposite the circuit board 214, than between the oscillator 202 and the circuit board 214.

An oscillator assembly such as that described with respect to FIG. 2 can help to improve frequency stability of an oscillator 202 or other such timing mechanism. A sealed housing 204 can help to at least partially isolate the oscillator from varying ambient temperature surrounding the oscillator assembly. Isolation of the oscillator can, in at least some implementations, also help to reduce the cost of the oscillator to be used for a given application, such as to be able to use a TCXO oscillator with isolation instead of a more expensive OCXO that might be needed if not for the improvement due to the isolation. Other oscillators can be used as well, as may include a quartz or microelectromechanical system (MEMS) oscillator, among other such options. Improving temperature stability can also help age compensation algorithms to be more effective, as there will be less instability or drift due to other, external factors. Improving oscillator frequency stability can also help to improve timing performance, such as the time error in locked state (e.g., of precision time protocol (PTP) and synchronous Ethernet (SyncE)), time uncertainty, and holdover.

Figure 3:
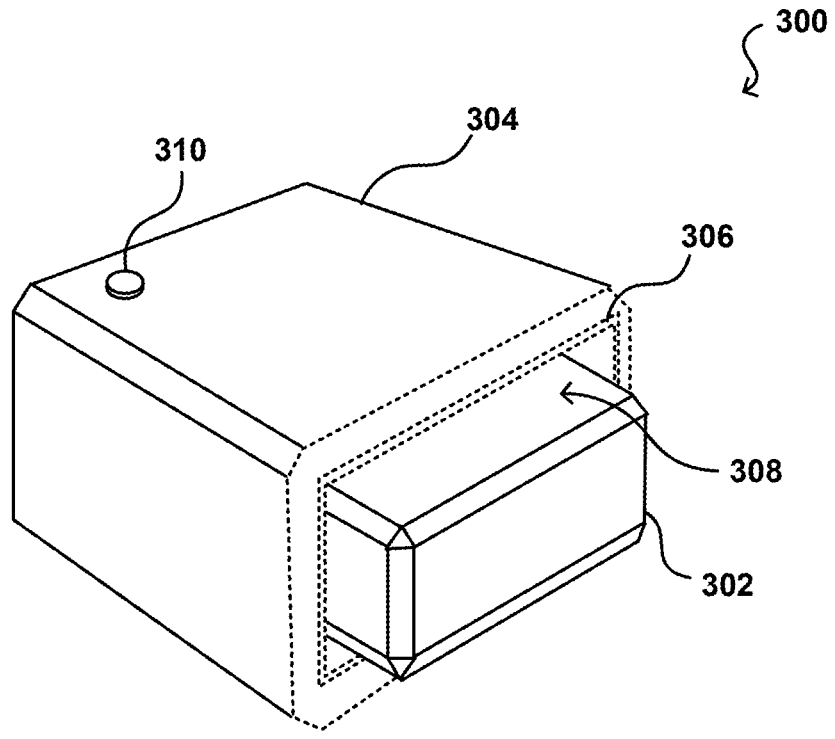
FIG. 3 illustrates a perspective view of an example oscillator assembly, according to at least one embodiment.

FIG. 3 illustrates a perspective view of an example isolated oscillator assembly 300, where an oscillator 302 is illustrated to be surrounded by a sealed housing 304. The sealed housing 304 is illustrated in a partial cutaway representation, but should be understood to completely encase the oscillator in its full form. As illustrated, the sealed housing 304 can surround an oscillator 302 in order to reduce heat transfer to the oscillator due to environmental conditions external to the sealed housing 304. The oscillator 302 is positioned in an inner chamber 308 of the sealed housing that is larger than the oscillator, creating a gap around a periphery of the oscillator 302. An inlet 310 can be used to pull gas from within the inner chamber 308 in order to reduce the pressure and, accordingly, heat transfer to the oscillator due to conduction. In some embodiments, a gas could instead be injected in place of the removed gas that could also provide for reduced conduction. A layer or coating of low emissivity blocking material 306 can be placed on, or proximate, an interior wall of the sealed housing 304 in order to reduce heat transfer by radiation to block at least a portion of the radiation incident on the sealed housing from reaching the oscillator.

An oscillator used for such purposes can be any appropriate electronic oscillator, or other electronic circuit or component, that is able to produce periodic output at a specified frequency. The output can be in any appropriate alternating form, such as a sine wave, square wave, and the like. In some embodiments an oscillator is powered by a direct current (DC) source but outputs an alternating current (AC) signal. A linear oscillator, such as a crystal oscillator, can be used where the frequency is produced by a vibrating crystal, such as a quartz crystal. Certain oscillators allow the output frequency to be specified and varied as appropriate. The oscillator can be a temperature-compensated crystal oscillator (TCXO), an oven controlled crystal oscillator (OCXO), or a MEMS oscillator in at least some embodiments. A TCXO typically includes a temperature-sensitive reactance circuit to compensate for the frequency-temperature characteristics inherent to the crystal used. An OCXO, on the other hand, includes an oven (or heater) and control circuitry that can be used to attempt to maintain the oscillator at a consistent temperature, in order to avoid temperature-depending variations in operating frequency. The temperature for an OCXO can be thermostatically controlled in at least one embodiment. An example OCXO has width and depth dimensions of 9 mm and 7 mm, respectively, and can be programmed to any frequency between 10 MHz and 60 MHz, in a temperature range up to about 95 degrees Celsius. Specific OCXO oscillators have dimensions of 25.4 mm in length by 22.0 mm in width by 12.1 mm in height, or 9 mm in length by 5 mm in width by 4 mm in height. By comparison, specific TCXO oscillators have dimensions of 7.55 mm in length by 5.55 mm in width by 3.4 mm in height, or 5 mm in length by 3.5 mm in width by 1.2 mm in height. An example OCXO also includes 10 connector pins that will pass through corresponding openings in the sealed housing. For such an oscillator, the gap around the oscillator can be in the range of about 0.5 mm to about 3.0 mm. The width of the blocking layer or coating can be in the range of about 0.5 mm to about 2.5 mm. The thickness of the walls of the sealed housing can be in the range of about 2 mm to about 5 mm. The entire size of the oscillator assembly can then be in the rage of about 10 mm to about 25 mm. It should be understood, however, that different sizes could be used with different oscillators or for different environments. For example, a different size oscillator can be appropriate for a server, versus a smart watch, an autonomous vehicle, a space craft or satellite, a network interface card, a network switch or router, or a robotic assembly, among other potential applications or uses that may be heavily dependent on accurate timing signals.

FIG. 4 illustrates an example process 400 that can be performed to provide an oscillator assembly that can maintain a stable operational frequency, in accordance with at least one embodiment. It should be understood that for this and other processes discussed herein that there may be additional, fewer, or alternative steps performed in similar or alternative orders, or at least partially in parallel, within the scope of the various embodiments. Further, although discussed with respect to an oscillator, it should be understood that advantages of thermal isolation can be obtained for other temperature-sensitive electronic components as well within the scope of various embodiments. In this example process, an oscillator housing can be provided 402 having an inner chamber and a layer of (at least partially) blocking material. An oscillator can be positioned 404 with respect to this lower portion such that connector pins of the oscillator pass through pin openings in the lower portion of the housing, enabling the oscillator to receive power and instructions, as well as to provide a timing signal, once the oscillator is sealed in the housing. A top portion of the housing can be connected 406 to the lower portion to create a sealed housing or enclosure, including a gap around the oscillator in the inner chamber. An air valve of the sealed chamber can be attached 408 to a vacuum pump in order to reduce a pressure inside the inner chamber, in the gap around the oscillator. The pumping of gas through the valve can effectively reduce the pressure in the inner chamber, to create a region of at least partial vacuum around the oscillator in the inner chamber. The combination of the surrounding region of at least partial vacuum with the sealed housing and blocking material can help to reduce temperature fluctuations incident on the oscillator through any of conduction, convection, or radiation. Once completed, the isolated oscillator assembly (including the oscillator in the sealed housing) can be provided 410 in order to provide a stable timing signal for one or more timing-critical components.

In at least some of these examples, computing and/or electronic devices may use oscillators for devices, such as switches, network interface cards (NICs), CPUs, and GPUs that can be used to perform various networking operations. The computing and/or electronic devices that use these oscillators can include a variety of different devices, as may include a desktop computer, notebook computer, set-top box, streaming device, gaming console, smartphone, tablet computer, VR headset, AR goggles, wearable computer, or a smart television. In at least one embodiment, such a system can be used for performing graphical rendering operations. In other embodiments, such a system can be used for other purposes, such as for providing image or video content to test or validate autonomous machine applications, or for performing deep learning operations. In at least one embodiment, such a system can be implemented using an edge device or may incorporate one or more Virtual Machines (VMs). In at least one embodiment, such a system can be implemented at least partially in a data center or at least partially using cloud computing resources.

Data Center

FIG. 5 illustrates an example data center 500, in which at least one embodiment may be used. In at least one embodiment, data center 500 includes a data center infrastructure layer 510, a framework layer 520, a software layer 530 and an application layer 540.

In at least one embodiment, as shown in FIG. 5, data center infrastructure layer 510 may include a resource orchestrator 512, grouped computing resources 514, and node computing resources ("node C.R.s") 516(1)-516(N), where "N" represents a positive integer (which may be a different integer "N" than used in other figures). In at least one embodiment, node C.R.s 516(1)-516(N) may include, but are not limited to, any number of central processing units ("CPUs") or other processors (including accelerators, field programmable gate arrays (FPGAs), graphics processors, etc.), memory storage devices 518(1)-518(N) (e.g., dynamic read-only memory, solid state storage or disk drives), network input/output ("NW I/O") devices, network switches, virtual machines ("VMs"), power modules, and cooling modules, etc. In at least one embodiment, one or more node C.R.s from among node C.R.s 516(1)-516(N) may be a server having one or more of above-mentioned computing resources.

In at least one embodiment, grouped computing resources 514 may include separate groupings of node C.R.s housed within one or more racks (not shown), or many racks housed in data centers at various geographical locations (also not shown). In at least one embodiment, separate groupings of node C.R.s within grouped computing resources 514 may include grouped compute, network, memory or storage resources that may be configured or allocated to support one or more workloads. In at least one embodiment, several node C.R.s including CPUs or processors may grouped within one or more racks to provide compute resources to support one or more workloads. In at least one embodiment, one or more racks may also include any number of power modules, cooling modules, and network switches, in any combination.

In at least one embodiment, resource orchestrator 512 may configure or otherwise control one or more node C.R.s 516(1)-516(N) and/or grouped computing resources 514. In at least one embodiment, resource orchestrator 512 may include a software design infrastructure ("SDI") management entity for data center 500. In at least one embodiment, resource orchestrator 512 may include hardware, software or some combination thereof.

In at least one embodiment, as shown in FIG. 5, framework layer 520 includes a job scheduler 522, a configuration manager 524, a resource manager 526 and a distributed file system 528. In at least one embodiment, framework layer 520 may include a framework to support software 532 of software layer 530 and/or one or more application(s) 542 of application layer 540. In at least one embodiment, software 532 or application(s) 542 may respectively include web-based service software or applications, such as those provided by Amazon Web Services, Google Cloud and Microsoft Azure. In at least one embodiment, framework layer 520 may be, but is not limited to, a type of free and open-source software web application framework such as Apache Spark™ (hereinafter "Spark") that may utilize distributed file system 528 for large-scale data processing (e.g., "big data"). In at least one embodiment, job scheduler 522 may include a Spark driver to facilitate scheduling of workloads supported by various layers of data center 500. In at least one embodiment, configuration manager 524 may be capable of configuring different layers such as software layer 530 and framework layer 520 including Spark and distributed file system 528 for supporting large-scale data processing. In at least one embodiment, resource manager 526 may be capable of managing clustered or grouped computing resources mapped to or allocated for support of distributed file system 528 and job scheduler 522. In at least one embodiment, clustered or grouped computing resources may include grouped computing resources 514 at data center infrastructure layer 510. In at least one embodiment, resource manager 526 may coordinate with resource orchestrator 512 to manage these mapped or allocated computing resources.

In at least one embodiment, software 532 included in software layer 530 may include software used by at least portions of node C.R.s 516(1)-516(N), grouped computing resources 514, and/or distributed file system 528 of framework layer 520. In at least one embodiment, one or more types of software may include, but are not limited to, Internet web page search software, e-mail virus scan software, database software, and streaming video content software.

In at least one embodiment, application(s) 542 included in application layer 540 may include one or more types of applications used by at least portions of node C.R.s 516(1)-516(N), grouped computing resources 514, and/or distributed file system 528 of framework layer 520. In at least one embodiment, one or more types of applications may include, but are not limited to, any number of a genomics application, a cognitive compute, application and a machine learning application, including training or inferencing software, machine learning framework software (e.g., PyTorch, TensorFlow, Caffe, etc.) or other machine learning applications used in conjunction with one or more embodiments.

In at least one embodiment, any of configuration manager 524, resource manager 526, and resource orchestrator 512 may implement any number and type of self-modifying actions based on any amount and type of data acquired in any technically feasible fashion. In at least one embodiment, self-modifying actions may relieve a data center operator of data center 500 from making possibly bad configuration decisions and possibly avoiding underutilized and/or poor performing portions of a data center.

In at least one embodiment, data center 500 may include tools, services, software or other resources to train one or more machine learning models or predict or infer information using one or more machine learning models according to one or more embodiments described herein. For example, in at least one embodiment, a machine learning model may be trained by calculating weight parameters according to a neural network architecture using software and computing resources described above with respect to data center 500. In at least one embodiment, trained machine learning models corresponding to one or more neural networks may be used to infer or predict information using resources described above with respect to data center 500 by using weight parameters calculated through one or more training techniques described herein.

In at least one embodiment, data center may use CPUs, application-specific integrated circuits (ASICs), GPUs, FPGAs, or other hardware to perform training and/or inferencing using above-described resources. Moreover, one or more software and/or hardware resources described above may be configured as a service to allow users to train or performing inferencing of information, such as image recognition, speech recognition, or other artificial intelligence services.

Inference and/or training logic 515 are used to perform inferencing and/or training operations associated with one or more embodiments. In at least one embodiment, inference and/or training logic 515 may be used in system FIG. 5 for inferencing or predicting operations based, at least in part, on weight parameters calculated using neural network training operations, neural network functions and/or architectures, or neural network use cases described herein.

Embodiments presented herein can provide for the improvement in stability of an oscillator through use of an isolated chamber surrounding the oscillator.

Computer Systems

Figure 6:
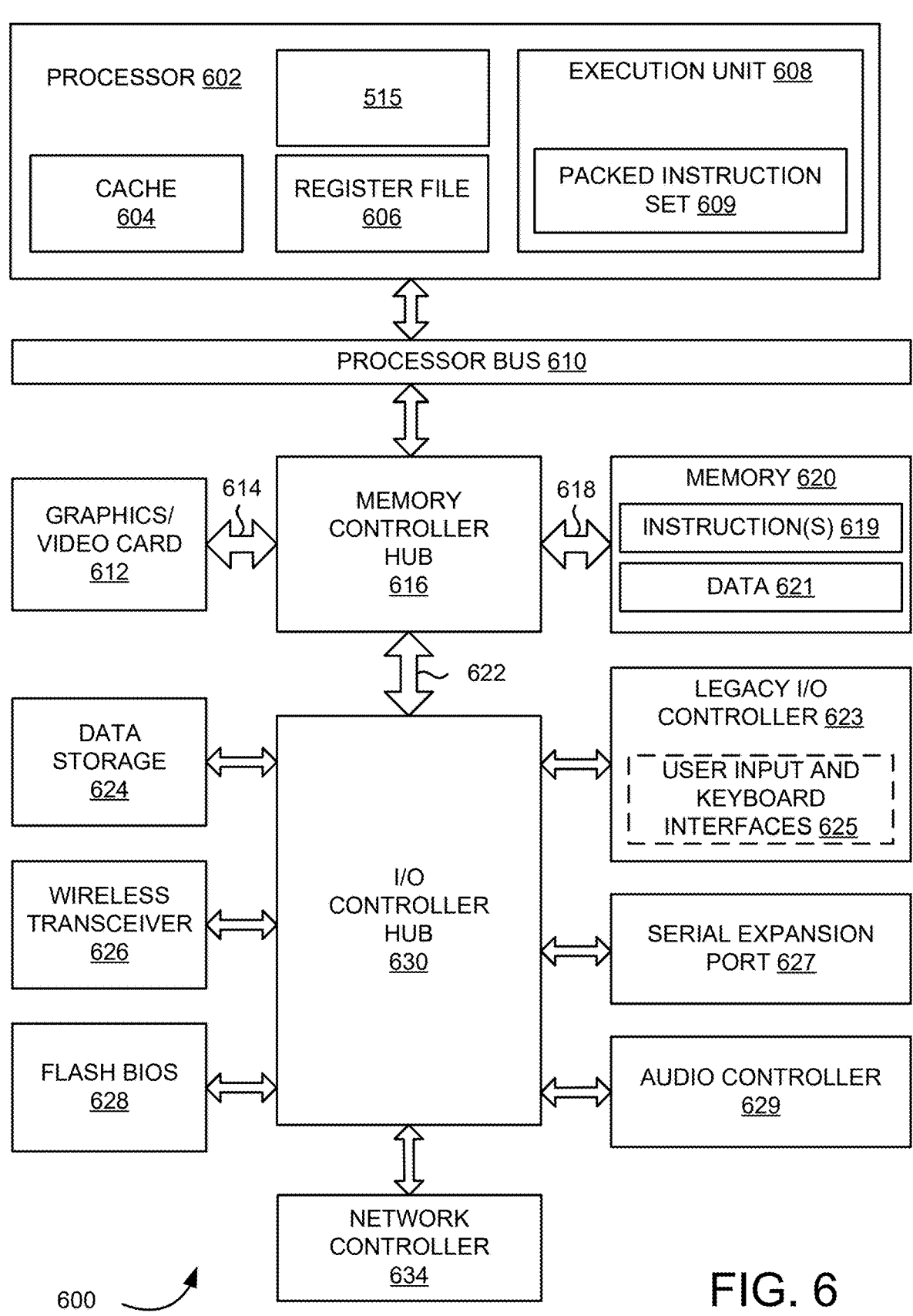
FIG. 6 is a block diagram illustrating a computer system, according to at least one embodiment.

FIG. 6 is a block diagram illustrating an exemplary computer system, which may be a system with interconnected devices and components, a system-on-a-chip (SOC) or some combination thereof formed with a processor that may include execution units to execute an instruction, according to at least one embodiment. In at least one embodiment, a computer system 600 may include, without limitation, a component, such as a processor 602 to employ execution units including logic to perform algorithms for process data, in accordance with present disclosure, such as in embodiment described herein. In at least one embodiment, computer system 600 may include processors, such as PENTIUM® Processor family, Xeon™, Itanium®, Scale™ and/or StrongARM™, Intel® Core™, or Intel® Nirvana™ microprocessors available from Intel Corporation of Santa Clara, California, although other systems (including PCs having other microprocessors, engineering workstations, set-top boxes and like) may also be used. In at least one embodiment, computer system 600 may execute a version of WINDOWS operating system available from Microsoft Corporation of Redmond, Wash., although other operating systems (UNIX and Linux, for example), embedded software, and/or graphical user interfaces, may also be used.

Embodiments may be used in other devices such as handheld devices and embedded applications. Some examples of handheld devices include cellular phones, Internet Protocol devices, digital cameras, personal digital assistants ("PDAs"), and handheld PCs. In at least one embodiment, embedded applications may include a microcontroller, a digital signal processor ("DSP"), system on a chip, network computers ("Necks"), set-top boxes, network hubs, wide area network ("WAN") switches, or any other system that may perform one or more instructions in accordance with at least one embodiment.

In at least one embodiment, computer system 600 may include, without limitation, processor 602 that may include, without limitation, one or more execution units 608 to perform machine learning model training and/or inferencing according to techniques described herein. In at least one embodiment, computer system 600 is a single processor desktop or server system, but in another embodiment, computer system 600 may be a multiprocessor system. In at least one embodiment, processor 602 may include, without limitation, a complex instruction set computer ("CISC") microprocessor, a reduced instruction set computing ("RISC") microprocessor, a very long instruction word ("VLIW") microprocessor, a processor implementing a combination of instruction sets, or any other processor device, such as a digital signal processor, for example. In at least one embodiment, processor 602 may be coupled to a processor bus 610 that may transmit data signals between processor 602 and other components in computer system 600.

In at least one embodiment, processor 602 may include, without limitation, a Level 1 ("L1") internal cache memory ("cache") 604. In at least one embodiment, processor 602 may have a single internal cache or multiple levels of internal cache. In at least one embodiment, cache memory may reside external to processor 602. Other embodiments may also include a combination of both internal and external caches depending on particular implementation and needs. In at least one embodiment, a register file 606 may store different types of data in various registers including, without limitation, integer registers, floating point registers, status registers, and an instruction pointer register.

In at least one embodiment, execution unit 608, including, without limitation, logic to perform integer and floating point operations, also resides in processor 602. In at least one embodiment, processor 602 may also include a microcode ("code") read only memory ("ROM") that stores microcode for certain macro instructions. In at least one embodiment, execution unit 608 may include logic to handle a packed instruction set 609. In at least one embodiment, by including packed instruction set 609 in an instruction set of a general-purpose processor, along with associated circuitry to execute instructions, operations used by many multimedia applications may be performed using packed data in processor 602. In at least one embodiment, many multimedia applications may be accelerated and executed more efficiently by using a full width of a processor's data bus for performing operations on packed data, which may eliminate a need to transfer smaller units of data across that processor's data bus to perform one or more operations one data element at a time.

In at least one embodiment, execution unit 608 may also be used in microcontrollers, embedded processors, graphics devices, DSPs, and other types of logic circuits. In at least one embodiment, computer system 600 may include, without limitation, a memory 620. In at least one embodiment, memory 620 may be a Dynamic Random Access Memory ("DRAM") device, a Static Random Access Memory ("SRAM") device, a flash memory device, or another memory device. In at least one embodiment, memory 620 may store instruction(s) 619 and/or data 621 represented by data signals that may be executed by processor 602.

In at least one embodiment, a system logic chip may be coupled to processor bus 610 and memory 620. In at least one embodiment, a system logic chip may include, without limitation, a memory controller hub ("MCH") 616, and processor 602 may communicate with MCH 616 via processor bus 610. In at least one embodiment, MCH 616 may provide a high bandwidth memory path 618 to memory 620 for instruction and data storage and for storage of graphics commands, data, and textures. In at least one embodiment, MCH 616 may direct data signals between processor 602, memory 620, and other components in computer system 600 and to bridge data signals between processor bus 610, memory 620, and a system I/O interface 622. In at least one embodiment, a system logic chip may provide a graphics port for coupling to a graphics controller. In at least one embodiment, MCH 616 may be coupled to memory 620 through high bandwidth memory path 618 and a graphics/ video card 612 may be coupled to MCH 616 through an Accelerated Graphics Port ("AGP") interconnect 614.

In at least one embodiment, computer system 600 may use system I/O interface 622 as a proprietary hub interface bus to couple MCH 616 to an I/O controller hub ("ICH") 630. In at least one embodiment, ICH 630 may provide direct connections to some I/O devices via a local I/O bus. In at least one embodiment, a local I/O bus may include, without limitation, a high-speed I/O bus for connecting peripherals to memory 620, a chipset, and processor 602. Examples may include, without limitation, an audio controller 629, a firmware hub ("flash BIOS") 628, a wireless transceiver 626, a data storage 624, a legacy I/O controller 623 containing user input and keyboard interfaces 625, a serial expansion port 627, such as a Universal Serial Bus ("USB") port, and a network controller 634. In at least one embodiment, data storage 624 may comprise a hard disk drive, a floppy disk drive, a CD-ROM device, a flash memory device, or other mass storage device.

In at least one embodiment, FIG. 6 illustrates a system, which includes interconnected hardware devices or "chips", whereas in other embodiments, FIG. 6 may illustrate an exemplary SoC In at least one embodiment, devices illustrated in FIG. 6 may be interconnected with proprietary interconnects, standardized interconnects (e.g., PCIe) or some combination thereof. In at least one embodiment, one or more components of computer system 600 are interconnected using compute express link (CXL) interconnects.

Inference and/or training logic 515 are used to perform inferencing and/or training operations associated with one or more embodiments. In at least one embodiment, inference and/or training logic 515 may be used in system FIG. 6 for inferencing or predicting operations based, at least in part, on weight parameters calculated using neural network training operations, neural network functions and/or architectures, or neural network use cases described herein.

Embodiments presented herein can provide for the improvement in stability of an oscillator through use of an isolated chamber surrounding the oscillator.

Figure 7:
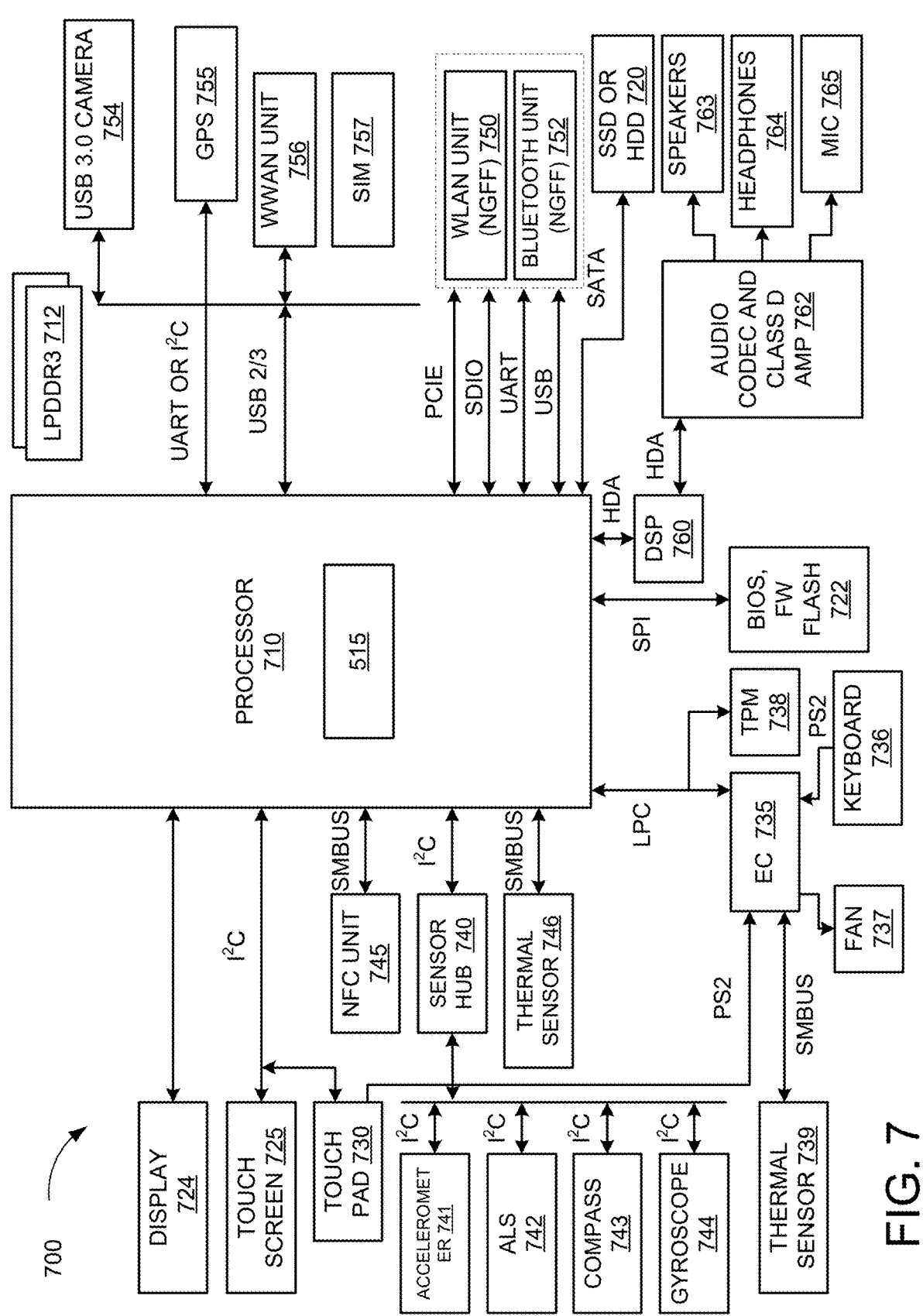
FIG. 7 is a block diagram illustrating a computer system, according to at least one embodiment.

FIG. 7 is a block diagram illustrating an electronic device 700 for utilizing a processor 710, according to at least one embodiment. In at least one embodiment, electronic device 700 may be, for example and without limitation, a notebook, a tower server, a rack server, a blade server, a laptop, a desktop, a tablet, a mobile device, a phone, an embedded computer, or any other suitable electronic device.

In at least one embodiment, electronic device 700 may include, without limitation, processor 710 communicatively coupled to any suitable number or kind of components, peripherals, modules, or devices. In at least one embodiment, processor 710 is coupled using a bus or interface, such as a I²C bus, a System Management Bus ("Sambas"), a Low Pin Count (LPC) bus, a Serial Peripheral Interface ("SPI"), a High Definition Audio ("HDA") bus, a Serial Advance Technology Attachment ("SATA") bus, a Universal Serial Bus ("USB") (versions 1, 2, 3, etc.), or a Universal Asynchronous Receiver/Transmitter ("UART") bus. In at least one embodiment, FIG. 7 illustrates a system, which includes interconnected hardware devices or "chips", whereas in other embodiments, FIG. 7 may illustrate an exemplary SoC. In at least one embodiment, devices illustrated in FIG. 7 may be interconnected with proprietary interconnects, standardized interconnects (e.g., PCIe) or some combination thereof. In at least one embodiment, one or more components of FIG. 7 are interconnected using compute express link (CXL) interconnects.

In at least one embodiment, FIG. 7 may include a display 724, a touch screen 725, a touch pad 730, a Near Field Communications unit ("NFC") 745, a sensor hub 740, a thermal sensor 746, an Express Chipset ("EC") 735, a Trusted Platform Module ("TPM") 738, BIOS/firmware/ flash memory ("BIOS, FW Flash") 722, a DSP 760, a drive 720 such as a Solid State Disk ("SSD") or a Hard Disk Drive ("HDD"), a wireless local area network unit ("WLAN") 750, a Bluetooth unit 752, a Wireless Wide Area Network unit ("WWAN") 756, a Global Positioning System (GPS) unit 755, a camera ("USB 3.0 camera") 754 such as a USB 3.0 camera, and/or a Low Power Double Data Rate ("LPDDR") memory unit ("LPDDR3") 715 implemented in, for example, an LPDDR3 standard. These components may each be implemented in any suitable manner.

In at least one embodiment, other components may be communicatively coupled to processor 710 through components described herein. In at least one embodiment, an accelerometer 741, an ambient light sensor ("ALS") 742, a compass 743, and a gyroscope 744 may be communicatively coupled to sensor hub 740. In at least one embodiment, a thermal sensor 739, a fan 737, a keyboard 736, and touch pad 730 may be communicatively coupled to EC 735. In at least one embodiment, speakers 763, headphones 764, and a microphone ("mic") 765 may be communicatively coupled to an audio unit ("audio codec and class D amp") 762, which may in turn be communicatively coupled to DSP 760. In at least one embodiment, audio unit 762 may include, for example and without limitation, an audio coder/decoder ("codec") and a class D amplifier. In at least one embodiment, a SIM card ("SIM") 757 may be communicatively coupled to WWAN unit 756. In at least one embodiment, components such as WLAN unit 750 and Bluetooth unit 752, as well as WWAN unit 756 may be implemented in a Next Generation Form Factor ("NGFF").

Inference and/or training logic 515 are used to perform inferencing and/or training operations associated with one or more embodiments. In at least one embodiment, inference and/or training logic 515 may be used in system FIG. 7 for inferencing or predicting operations based, at least in part, on weight parameters calculated using neural network training operations, neural network functions and/or architectures, or neural network use cases described herein.

Embodiments presented herein can provide for the improvement in stability of an oscillator through use of an isolated chamber surrounding the oscillator.

Figure 8:
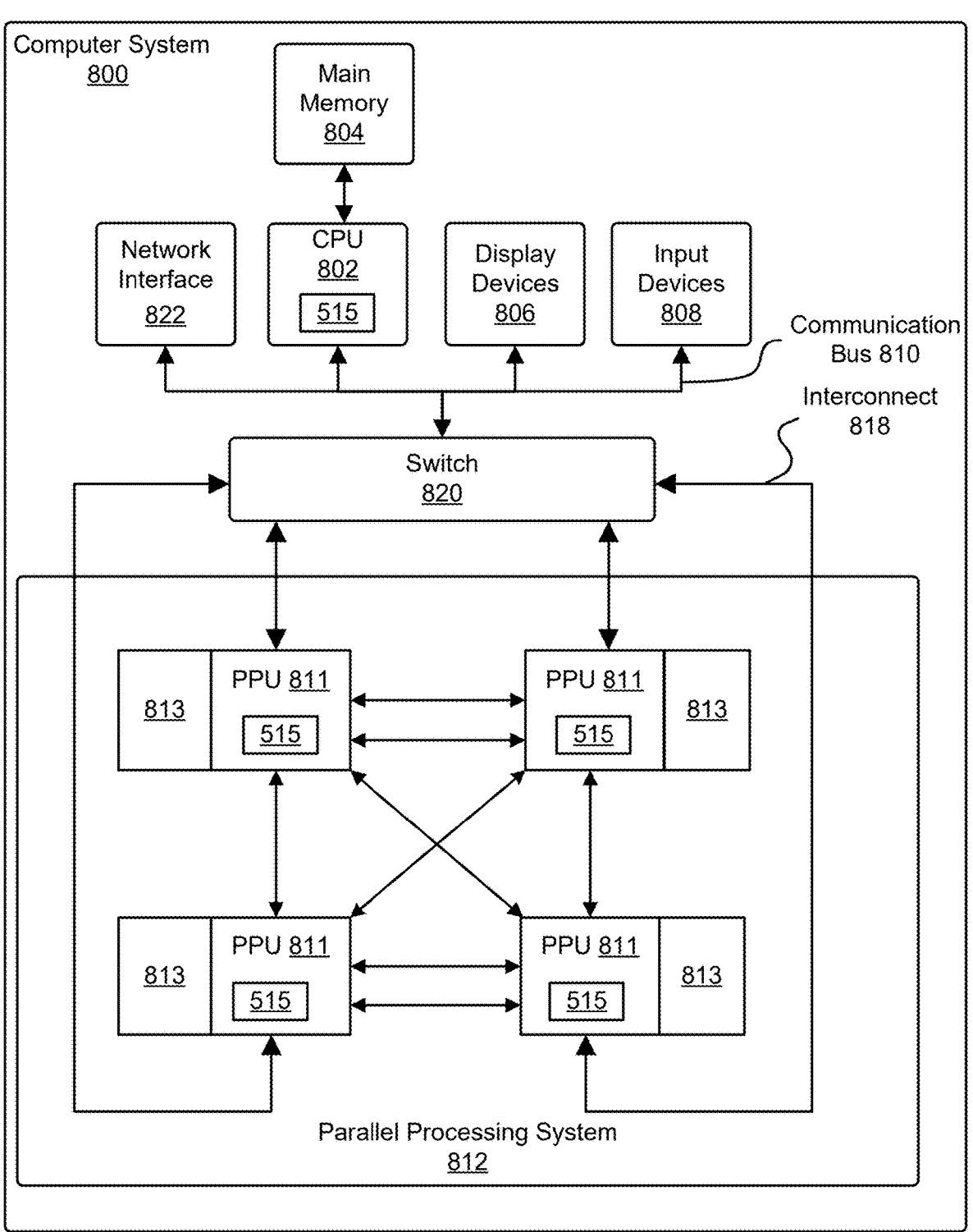
FIG. 8 illustrates a computer system, according to at least one embodiment.

FIG. 8 illustrates a computer system 800, according to at least one embodiment. In at least one embodiment, computer system 800 is configured to implement various processes and methods described throughout this disclosure.

In at least one embodiment, computer system 800 comprises, without limitation, at least one central processing unit ("CPU") 802 that is connected to a communication bus 810 implemented using any suitable protocol, such as PCI ("Peripheral Component Interconnect"), peripheral component interconnect express ("PCI-Express"), AGP ("Accelerated Graphics Port"), HyperTransport, or any other bus or point-to-point communication protocol(s). In at least one embodiment, computer system 800 includes, without limitation, a main memory 804 and control logic (e.g., implemented as hardware, software, or a combination thereof) and data are stored in main memory 804, which may take form of random access memory ("RAM"). In at least one embodiment, a network interface subsystem ("network interface") 822 provides an interface to other computing devices and networks for receiving data from and transmitting data to other systems with computer system 800.

In at least one embodiment, computer system 800, in at least one embodiment, includes, without limitation, input devices 808, a parallel processing system 812, and display devices 806 that can be implemented using a conventional cathode ray tube ("CRT"), a liquid crystal display ("LCD"), a light emitting diode ("LED") display, a plasma display, or other suitable display technologies. In at least one embodiment, user input is received from input devices 808 such as keyboard, mouse, touchpad, microphone, etc. In at least one embodiment, each module described herein can be situated on a single semiconductor platform to form a processing system.

Inference and/or training logic 515 are used to perform inferencing and/or training operations associated with one or more embodiments. In at least one embodiment, inference and/or training logic 515 may be used in system FIG. 8 for inferencing or predicting operations based, at least in part, on weight parameters calculated using neural network training operations, neural network functions and/or architectures, or neural network use cases described herein.

Embodiments presented herein can provide for the improvement in stability of an oscillator through use of an isolated chamber surrounding the oscillator.

Figure 9:
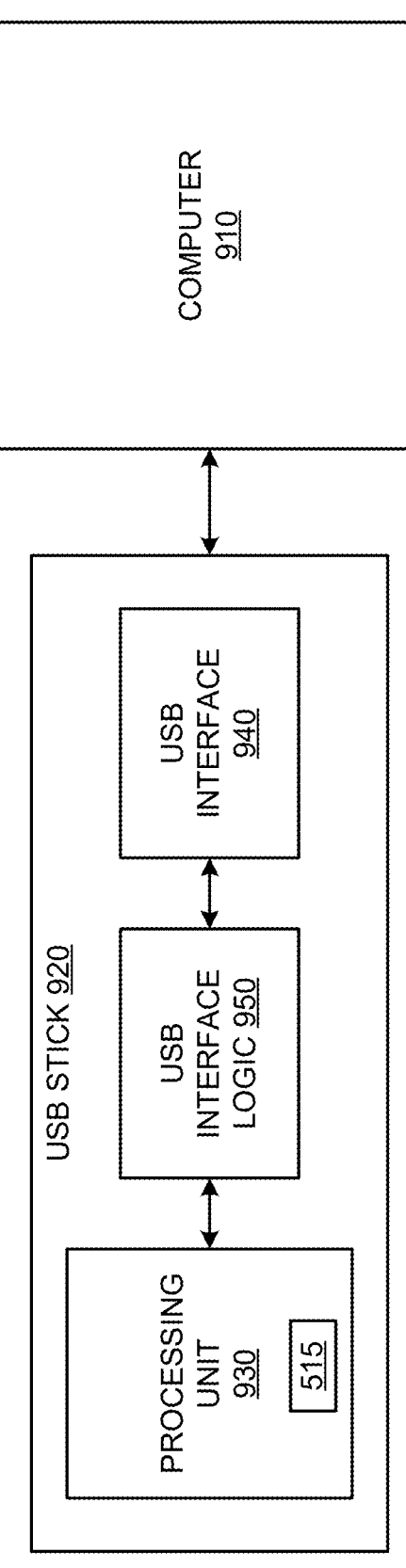
FIG. 9 illustrates a computer system, according to at least one embodiment.

FIG. 9 illustrates a computer system 900, according to at least one embodiment. In at least one embodiment, computer system 900 includes, without limitation, a computer 910 and a USB stick 920. In at least one embodiment, computer 910 may include, without limitation, any number and type of processor(s) (not shown) and a memory (not shown). In at least one embodiment, computer 910 includes, without limitation, a server, a cloud instance, a laptop, and a desktop computer.

In at least one embodiment, USB stick 920 includes, without limitation, a processing unit 930, a USB interface 940, and USB interface logic 950. In at least one embodiment, processing unit 930 may be any instruction execution system, apparatus, or device capable of executing instructions. In at least one embodiment, processing unit 930 may include, without limitation, any number and type of processing cores (not shown). In at least one embodiment, processing unit 930 comprises an application specific integrated circuit ("ASIC") that is optimized to perform any amount and type of operations associated with machine learning. For instance, in at least one embodiment, processing unit 930 is a tensor processing unit ("TPC") that is optimized to perform machine learning inference operations. In at least one embodiment, processing unit 930 is a vision processing unit ("VPU") that is optimized to perform machine vision and machine learning inference operations.

In at least one embodiment, USB interface 940 may be any type of USB connector or USB socket. For instance, in at least one embodiment, USB interface 940 is a USB 3.0 Type-C socket for data and power. In at least one embodiment, USB interface 940 is a USB 3.0 Type-A connector. In at least one embodiment, USB interface logic 950 may include any amount and type of logic that enables processing unit 930 to interface with devices (e.g., computer 910) via USB connector 940.

Inference and/or training logic 515 are used to perform inferencing and/or training operations associated with one or more embodiments. In at least one embodiment, inference and/or training logic 515 may be used in system FIG. 9 for inferencing or predicting operations based, at least in part, on weight parameters calculated using neural network training operations, neural network functions and/or architectures, or neural network use cases described herein.

Embodiments presented herein can provide for the improvement in stability of an oscillator through use of an isolated chamber surrounding the oscillator.

Figure 10:
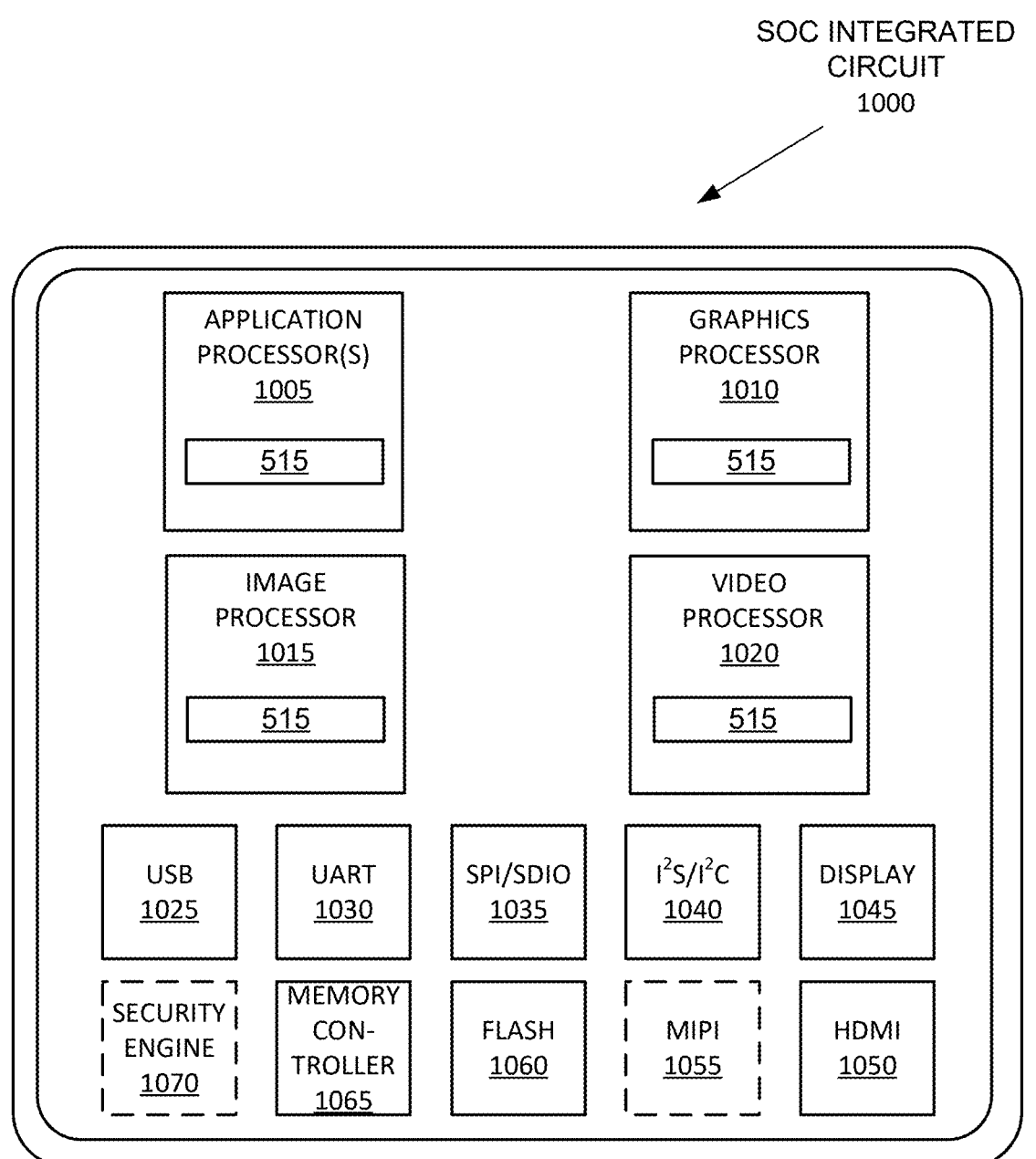
FIG. 10 illustrates exemplary integrated circuits and associated graphics processors, according to at least one embodiment.

FIG. 10 illustrates exemplary integrated circuits and associated graphics processors that may be fabricated using one or more IP cores, according to various embodiments described herein. In addition to what is illustrated, other logic and circuits may be included in at least one embodiment, including additional graphics processors/cores, peripheral interface controllers, or general-purpose processor cores.

FIG. 10 is a block diagram illustrating an exemplary system-on-a-chip (SOC) integrated circuit 1000 that may be fabricated using one or more IP cores, according to at least one embodiment. In at least one embodiment, SOC integrated circuit 1000 includes one or more application processor(s) 1005 (e.g., CPUs), at least one graphics processor 1010, and may additionally include an image processor 1015 and/or a video processor 1020, any of which may be a modular IP core. In at least one embodiment, SOC integrated circuit 1000 includes peripheral or bus logic including a USB controller 1025, a UART controller 1030, an SPI/SDIO controller 1035, and an $I^2S/I^2C$ controller 1040. In at least one embodiment, SOC integrated circuit 1000 can include a display device 1045 coupled to one or more of a high-definition multimedia interface (HDMI) controller 1050 and a mobile industry processor interface (MIPI) display interface 1055. In at least one embodiment, storage may be provided by a flash memory subsystem 1060 including flash memory and a flash memory controller. In at least one embodiment, a memory interface may be provided via a memory controller 1065 for access to SDRAM or SRAM memory devices. In at least one embodiment, some integrated circuits additionally include an embedded security engine 1070.

Inference and/or training logic 515 are used to perform inferencing and/or training operations associated with one or more embodiments. In at least one embodiment, inference and/or training logic 515 may be used in SOC integrated circuit 1000 for inferencing or predicting operations based, at least in part, on weight parameters calculated using neural network training operations, neural network functions and/or architectures, or neural network use cases described herein.

Embodiments presented herein can provide for the improvement in stability of an oscillator through use of an isolated chamber surrounding the oscillator.

Figure 11A:

FIGS. 11A-11B illustrate exemplary integrated circuits and associated graphics processors that may be fabricated using one or more IP cores, according to various embodiments described herein. In addition to what is illustrated, other logic and circuits may be included in at least one embodiment, including additional graphics processors/cores, peripheral interface controllers, or general-purpose processor cores.

FIGS. 11A-11B are block diagrams illustrating exemplary graphics processors for use within an SoC, according to embodiments described herein. FIG. 11A illustrates an exemplary graphics processor 1110 of a system on a chip integrated circuit that may be fabricated using one or more IP cores, according to at least one embodiment. FIG. 11B illustrates an additional exemplary graphics processor 1140 of a system on a chip integrated circuit that may be fabricated using one or more IP cores, according to at least one embodiment. In at least one embodiment, graphics processor 1110 of FIG. 11A is a low power graphics processor core. In at least one embodiment, graphics processor 1140 of FIG. 11B is a higher performance graphics processor core. In at least one embodiment, each of graphics processors 1110, 1140 can be variants of computer system 900 of FIG. 9.

In at least one embodiment, graphics processor 1110 includes a vertex processor 1105 and one or more fragment processor(s) 1115A-1115N (e.g., 1115A, 1115B, 1115C, 1115D, through 1115N-1, and 1115N). In at least one embodiment, graphics processor 1110 can execute different shader programs via separate logic, such that vertex processor 1105 is optimized to execute operations for vertex shader programs, while one or more fragment processor(s) 1115A-1115N execute fragment (e.g., pixel) shading operations for fragment or pixel shader programs. In at least one embodiment, vertex processor 1105 performs a vertex processing stage of a 3D graphics pipeline and generates primitives and vertex data. In at least one embodiment, fragment processor (s) 1115A-1115N use primitive and vertex data generated by vertex processor 1105 to produce a framebuffer that is displayed on a display device. In at least one embodiment, fragment processor(s) 1115A-1115N are optimized to execute fragment shader programs as provided for in an OpenGL API, which may be used to perform similar operations as a pixel shader program as provided for in a Direct 3D API.

In at least one embodiment, graphics processor 1110 additionally includes one or more memory management units (MMUs) 1120A-1120B, cache(s) 1125A-1125B, and circuit interconnect(s) 1130A-1130B. In at least one embodiment, one or more MMU(s) 1120A-1120B provide for virtual to physical address mapping for graphics processor 1110, including for vertex processor 1105 and/or fragment processor(s) 1115A-1115N, which may reference vertex or image/texture data stored in memory, in addition to vertex or image/texture data stored in one or more cache(s) 1125A-1125B. In at least one embodiment, one or more MMU(s) 1120A-1120B may be synchronized with other MMUs within a system, including one or more MMUs associated with one or more application processor(s) 1105, image processors 1115, and/or video processors 1120 of FIG. 11A, such that each processor 1105-1120 can participate in a shared or unified virtual memory system. In at least one embodiment, one or more circuit interconnect(s) 1130A-1130B enable graphics processor 1110 to interface with other IP cores within SoC, either via an internal bus of SoC or via a direct connection.

In at least one embodiment, graphics processor 1140 includes one or more shader core(s) 1155A-1155N (e.g., 1155A, 1155B, 1155C, 1155D, 1155E, 1155F, through 1155N-1, and 1155N) as shown in FIG. 11B, which provides for a unified shader core architecture in which a single core or type or core can execute all types of programmable shader code, including shader program code to implement vertex shaders, fragment shaders, and/or compute shaders. In at least one embodiment, a number of shader cores can vary. In at least one embodiment, graphics processor 1140 includes an inter-core task manager 1145, which acts as a thread dispatcher to dispatch execution threads to one or more shader cores 1155A-1155N and a tiling unit 1158 to accelerate tiling operations for tile-based rendering, in which rendering operations for a scene are subdivided in image space, for example to exploit local spatial coherence within a scene or to optimize use of internal caches.

Embodiments presented herein can provide for the improvement in stability of an oscillator through use of an isolated chamber surrounding the oscillator.

Figure 12:
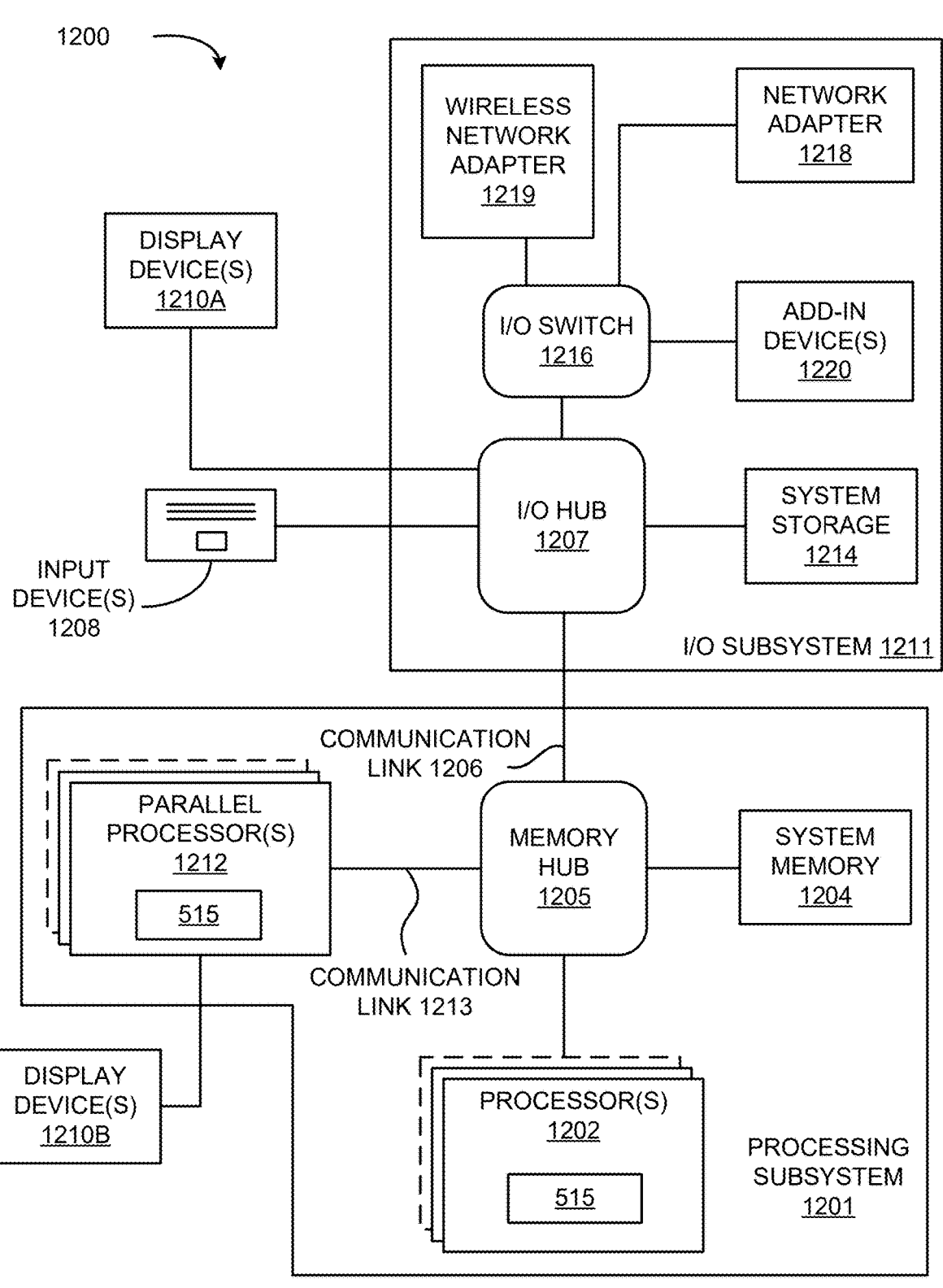
FIG. 12 illustrates a computer system, according to at least one embodiment.

FIG. 12 is a block diagram illustrating a computing system 1200 according to at least one embodiment. In at least one embodiment, computing system 1200 includes a processing subsystem 1201 having one or more processor(s) 1202 and a system memory 1204 communicating via an interconnection path that may include a memory hub 1205. In at least one embodiment, memory hub 1205 may be a separate component within a chipset component or may be integrated within one or more processor(s) 1202. In at least one embodiment, memory hub 1205 couples with an I/O subsystem 1211 via a communication link 1206. In at least one embodiment, I/O subsystem 1211 includes an I/O hub 1207 that can enable computing system 1200 to receive input from one or more input device(s) 1208. In at least one embodiment, I/O hub 1207 can enable a display controller, which may be included in one or more processor(s) 1202, to provide outputs to one or more display device(s) 1210A. In at least one embodiment, one or more display device(s) 1210A coupled with I/O hub 1207 can include a local, internal, or embedded display device.

In at least one embodiment, processing subsystem 1201 includes one or more parallel processor(s) 1212 coupled to memory hub 1205 via a bus or other communication link 1213. In at least one embodiment, communication link 1213 may use one of any number of standards based communication link technologies or protocols, such as but not limited to PCI Express, or may be a vendor-specific communications interface or communications fabric. In at least one embodiment, one or more parallel processor(s) 1212 form a computationally focused parallel or vector processing system that can include a large number of processing cores and/or processing clusters, such as a many-integrated core (MIC) processor. In at least one embodiment, some or all of parallel processor(s) 1212 form a graphics processing subsystem that can output pixels to one of one or more display device(s) 1210A coupled via I/O hub 1207. In at least one embodiment, parallel processor(s) 1212 can also include a display controller and display interface (not shown) to enable a direct connection to one or more display device(s) 1210B. In at least one embodiment, parallel processor(s) 1212 include one or more cores, such as graphics cores 1200 discussed herein.

In at least one embodiment, a system storage unit 1214 can connect to I/O hub 1207 to provide a storage mechanism for computing system 1200. In at least one embodiment, an I/O switch 1216 can be used to provide an interface mechanism to enable connections between I/O hub 1207 and other components, such as a network adapter 1218 and/or a wireless network adapter 1219 that may be integrated into platform, and various other devices that can be added via one or more add-in device(s) 1220. In at least one embodiment, network adapter 1218 can be an Ethernet adapter or another wired network adapter. In at least one embodiment, wireless network adapter 1219 can include one or more of a Wi-Fi, Bluetooth, near field communication (NFC), or other network device that includes one or more wireless radios.

In at least one embodiment, computing system 1200 can include other components not explicitly shown, including USB or other port connections, optical storage drives, video capture devices, and like, may also be connected to I/O hub 1207. In at least one embodiment, communication paths interconnecting various components in FIG. 12 may be implemented using any suitable protocols, such as PCI (Peripheral Component Interconnect) based protocols (e.g., PCI-Express), or other bus or point-to-point communication interfaces and/or protocol(s), such as NV-Link high-speed interconnect, or interconnect protocols.

In at least one embodiment, parallel processor(s) 1212 incorporate circuitry optimized for graphics and video processing, including, for example, video output circuitry, and constitutes a graphics processing unit (GPU), e.g., parallel processor(s) 1212 includes graphics core 1200. In at least one embodiment, parallel processor(s) 1212 incorporate circuitry optimized for general purpose processing. In at least embodiment, components of computing system 1200 may be integrated with one or more other system elements on a single integrated circuit. For example, in at least one embodiment, parallel processor(s) 1212, memory hub 1205, processor(s) 1202, and I/O hub 1207 can be integrated into a system on chip (SoC) integrated circuit. In at least one embodiment, components of computing system 1200 can be integrated into a single package to form a system in package (SIP) configuration. In at least one embodiment, at least a portion of components of computing system 1200 can be integrated into a multi-chip module (MCM), which can be interconnected with other multi-chip modules into a modular computing system.

Inference and/or training logic 515 are used to perform inferencing and/or training operations associated with one or more embodiments. In at least one embodiment, inference and/or training logic 515 may be used in system FIG. 12 for inferencing or predicting operations based, at least in part, on weight parameters calculated using neural network training operations, neural network functions and/or architectures, or neural network use cases described herein.

Embodiments presented herein can provide for the improvement in stability of an oscillator through use of an isolated chamber surrounding the oscillator.

Processors

Figure 13A:
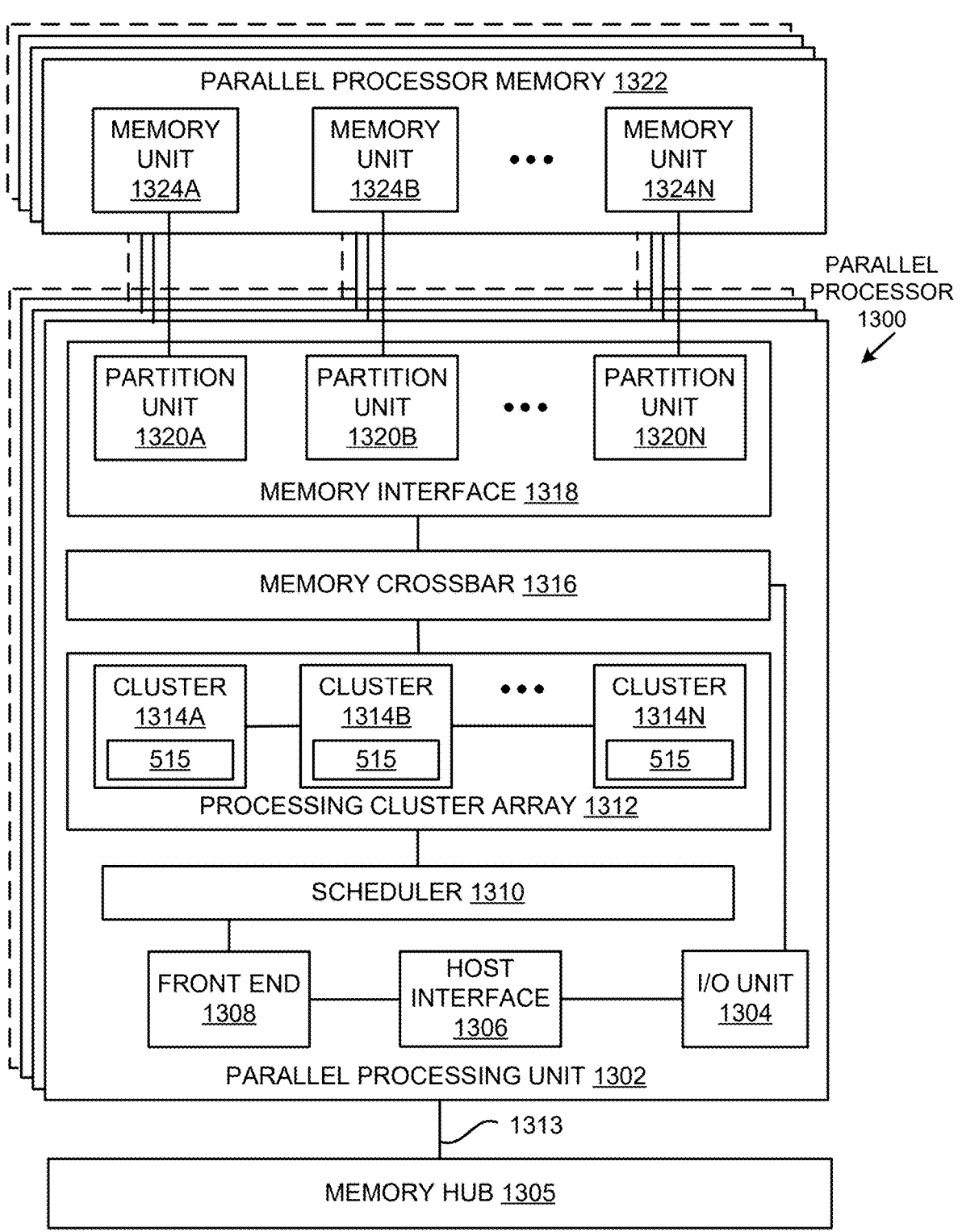
FIG. 13A illustrates a parallel processor, according to at least one embodiment.

FIG. 13A illustrates a parallel processor 1300 according to at least one embodiment. In at least one embodiment, various components of parallel processor 1300 may be implemented using one or more integrated circuit devices, such as programmable processors, application specific integrated circuits (ASICs), or field programmable gate arrays (FPGA). In at least one embodiment, illustrated parallel processor 1300 is a variant of one or more parallel processor(s) 1212 shown in FIG. 12 according to an exemplary embodiment. In at least one embodiment, a parallel processor 1300 includes one or more graphics cores 1200.

In at least one embodiment, parallel processor 1300 includes a parallel processing unit 1302. In at least one embodiment, parallel processing unit 1302 includes an I/O unit 1304 that enables communication with other devices, including other instances of parallel processing unit 1302. In at least one embodiment, I/O unit 1304 may be directly connected to other devices. In at least one embodiment, I/O unit 1304 connects with other devices via use of a hub or switch interface, such as a memory hub 1305. In at least one embodiment, connections between memory hub 1305 and I/O unit 1304 form a communication link 1313. In at least one embodiment, I/O unit 1304 connects with a host interface 1306 and a memory crossbar 1316, where host interface 1306 receives commands directed to performing processing operations and memory crossbar 1316 receives commands directed to performing memory operations. In at least one embodiment, when host interface 1306 receives a command buffer via I/O unit 1304, host interface 1306 can direct work operations to perform those commands to a front end 1308. In at least one embodiment, front end 1308 couples with a scheduler 1310 (which may be referred to as a sequencer), which is configured to distribute commands or other work items to a processing cluster array 1312. In at least one embodiment, scheduler 1310 ensures that processing cluster array 1312 is properly configured and in a valid state before tasks are distributed to a cluster of processing cluster array 1312. In at least one embodiment, scheduler 1310 is implemented via firmware logic executing on a microcontroller. In at least one embodiment, microcontroller implemented scheduler 1310 is configurable to perform complex scheduling and work distribution operations at coarse and fine granularity, enabling rapid preemption and context switching of threads executing on processing array 1312. In at least one embodiment, host software can prove workloads for scheduling on processing cluster array 1312 via one of multiple graphics processing paths. In at least one embodiment, workloads can then be automatically distributed across processing array cluster 1312 by scheduler 1310 logic within a microcontroller including scheduler 1310.

In at least one embodiment, processing cluster array 1312 can include up to "N" processing clusters (e.g., cluster 1314A, cluster 1314B, through cluster 1314N), where "N" represents a positive integer (which may be a different integer "N" than used in other figures). In at least one embodiment, each cluster 1314A-1314N of processing cluster array 1312 can execute a large number of concurrent threads. In at least one embodiment, scheduler 1310 can allocate work to clusters 1314A-1314N of processing cluster array 1312 using various scheduling and/or work distribution algorithms, which may vary depending on workload arising for each type of program or computation. In at least one embodiment, scheduling can be handled dynamically by scheduler 1310, or can be assisted in part by compiler logic during compilation of program logic configured for execution by processing cluster array 1312. In at least one embodiment, different clusters 1314A-1314N of processing cluster array 1312 can be allocated for processing different types of programs or for performing different types of computations.

In at least one embodiment, processing cluster array 1312 can be configured to perform various types of parallel processing operations. In at least one embodiment, processing cluster array 1312 is configured to perform general-purpose parallel compute operations. For example, in at least one embodiment, processing cluster array 1312 can include logic to execute processing tasks including filtering of video and/or audio data, performing modeling operations, including physics operations, and performing data transformations.

In at least one embodiment, processing cluster array 1312 is configured to perform parallel graphics processing operations. In at least one embodiment, processing cluster array 1312 can include additional logic to support execution of such graphics processing operations, including but not limited to, texture sampling logic to perform texture operations, as well as tessellation logic and other vertex processing logic. In at least one embodiment, processing cluster array 1312 can be configured to execute graphics processing related shader programs such as but not limited to, vertex shaders, tessellation shaders, geometry shaders, and pixel shaders. In at least one embodiment, parallel processing unit 1302 can transfer data from system memory via I/O unit 1304 for processing. In at least one embodiment, during processing, transferred data can be stored to on-chip memory (e.g., parallel processor memory 1322) during processing, then written back to system memory.

In at least one embodiment, when parallel processing unit 1302 is used to perform graphics processing, scheduler 1310 can be configured to divide a processing workload into approximately equal sized tasks, to better enable distribution of graphics processing operations to multiple clusters 1314A-1314N of processing cluster array 1312. In at least one embodiment, portions of processing cluster array 1312 can be configured to perform different types of processing. For example, in at least one embodiment, a first portion may be configured to perform vertex shading and topology generation, a second portion may be configured to perform tessellation and geometry shading, and a third portion may be configured to perform pixel shading or other screen space operations, to produce a rendered image for display. In at least one embodiment, intermediate data produced by one or more of clusters 1314A-1314N may be stored in buffers to allow intermediate data to be transmitted between clusters 1314A-1314N for further processing.

In at least one embodiment, processing cluster array 1312 can receive processing tasks to be executed via scheduler 1310, which receives commands defining processing tasks from front end 1308. In at least one embodiment, processing tasks can include indices of data to be processed, e.g., surface (patch) data, primitive data, vertex data, and/or pixel data, as well as state parameters and commands defining how data is to be processed (e.g., what program is to be executed). In at least one embodiment, scheduler 1310 may be configured to fetch indices corresponding to tasks or may receive indices from front end 1308. In at least one embodiment, front end 1308 can be configured to ensure processing cluster array 1312 is configured to a valid state before a workload specified by incoming command buffers (e.g., batch-buffers, push buffers, etc.) is initiated.

In at least one embodiment, each of one or more instances of parallel processing unit 1302 can couple with a parallel processor memory 1322. In at least one embodiment, parallel processor memory 1322 can be accessed via memory crossbar 1316, which can receive memory requests from processing cluster array 1312 as well as I/O unit 1304. In at least one embodiment, memory crossbar 1316 can access parallel processor memory 1322 via a memory interface 1318. In at least one embodiment, memory interface 1318 can include multiple partition units (e.g., partition unit 1320A, partition unit 1320B, through partition unit 1320N) that can each couple to a portion (e.g., memory unit) of parallel processor memory 1322. In at least one embodiment, a number of partition units 1320A-1320N is configured to be equal to a number of memory units, such that a first partition unit 1320A has a corresponding first memory unit 1324A, a second partition unit 1320B has a corresponding memory unit 1324B, and an N-th partition unit 1320N has a corresponding N-th memory unit 1324N. In at least one embodiment, a number of partition units 1320A-1320N may not be equal to a number of memory units.

In at least one embodiment, memory units 1324A-1324N can include various types of memory devices, including dynamic random access memory (DRAM) or graphics random access memory, such as synchronous graphics random access memory (SGRAM), including graphics double data rate (GDDR) memory. In at least one embodiment, memory units 1324A-1324N may also include 3D stacked memory, including but not limited to high bandwidth memory (HBM), HBM2e, or HDM3. In at least one embodiment, render targets, such as frame buffers or texture maps may be stored across memory units 1324A-1324N, allowing partition units 1320A-1320N to write portions of each render target in parallel to efficiently use available bandwidth of parallel processor memory 1322. In at least one embodiment, a local instance of parallel processor memory 1322 may be excluded in favor of a unified memory design that utilizes system memory in conjunction with local cache memory.

In at least one embodiment, any one of clusters 1314A-1314N of processing cluster array 1312 can process data that will be written to any of memory units 1324A-1324N within parallel processor memory 1322. In at least one embodiment, memory crossbar 1316 can be configured to transfer an output of each cluster 1314A-1314N to any partition unit 1320A-1320N or to another cluster 1314A-1314N, which can perform additional processing operations on an output. In at least one embodiment, each cluster 1314A-1314N can communicate with memory interface 1318 through memory crossbar 1316 to read from or write to various external memory devices. In at least one embodiment, memory crossbar 1316 has a connection to memory interface 1318 to communicate with I/O unit 1304, as well as a connection to a local instance of parallel processor memory 1322, enabling processing units within different processing clusters 1314A-1314N to communicate with system memory or other memory that is not local to parallel processing unit 1302. In at least one embodiment, memory crossbar 1316 can use virtual channels to separate traffic streams between clusters 1314A-1314N and partition units 1320A-1320N.

In at least one embodiment, multiple instances of parallel processing unit 1302 can be provided on a single add-in card, or multiple add-in cards can be interconnected. In at least one embodiment, different instances of parallel processing unit 1302 can be configured to interoperate even if different instances have different numbers of processing cores, different amounts of local parallel processor memory, and/or other configuration differences. For example, in at least one embodiment, some instances of parallel processing unit 1302 can include higher precision floating point units relative to other instances. In at least one embodiment, systems incorporating one or more instances of parallel processing unit 1302 or parallel processor 1300 can be implemented in a variety of configurations and form factors, including but not limited to desktop, laptop, or handheld personal computers, servers, workstations, game consoles, and/or embedded systems.

Figure 13B:
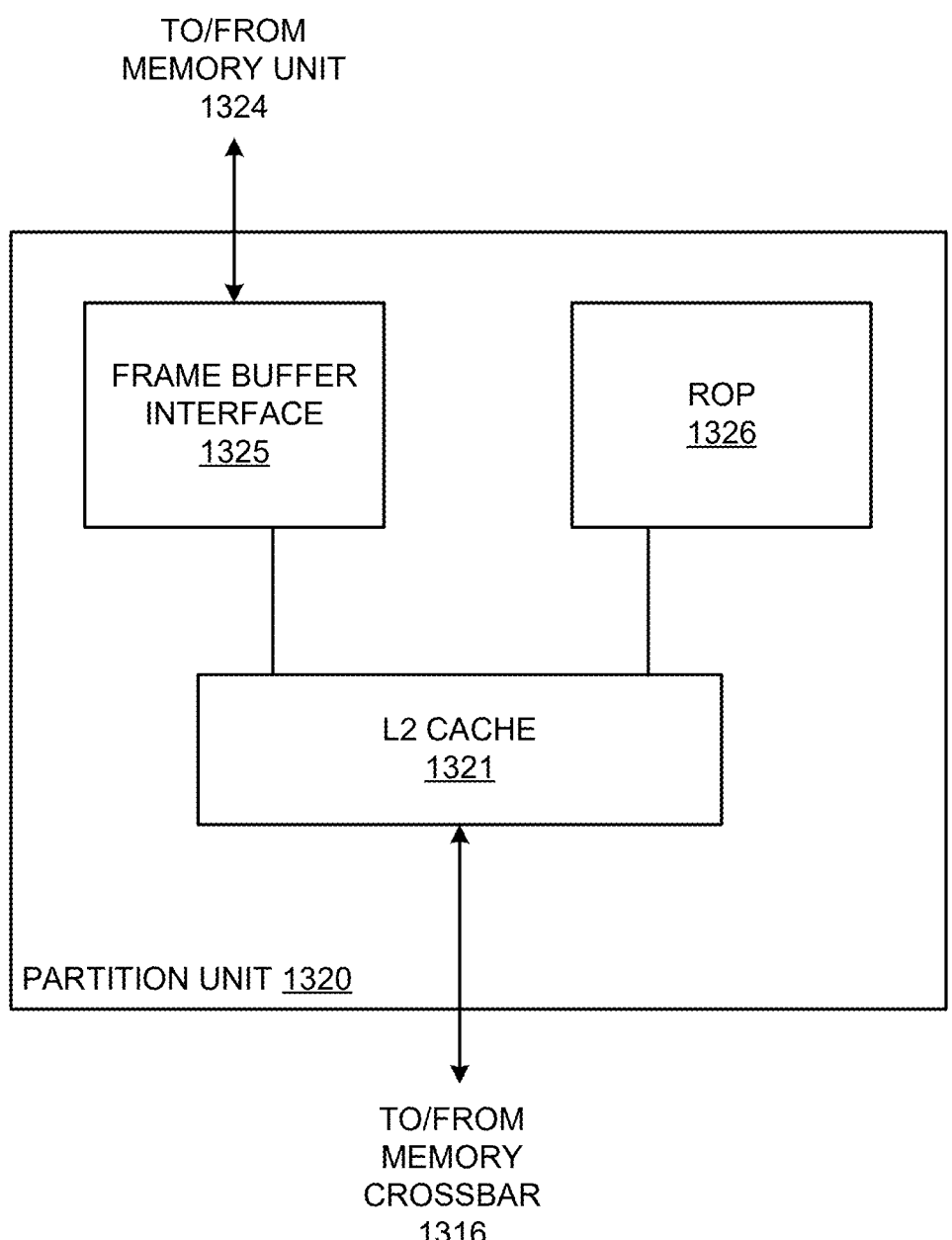
FIG. 13B illustrates a partition unit, according to at least one embodiment.

FIG. 13B is a block diagram of a partition unit 1320 according to at least one embodiment. In at least one embodiment, partition unit 1320 is an instance of one of partition units 1320A-1320N of FIG. 13A. In at least one embodiment, partition unit 1320 includes an L2 cache 1321, a frame buffer interface 1325, and a ROP 1326 (raster operations unit). In at least one embodiment, L2 cache 1321 is a read/write cache that is configured to perform load and store operations received from memory crossbar 1316 and ROP 1326. In at least one embodiment, read misses and urgent write-back requests are output by L2 cache 1321 to frame buffer interface 1325 for processing. In at least one embodiment, updates can also be sent to a frame buffer via frame buffer interface 1325 for processing. In at least one embodiment, frame buffer interface 1325 interfaces with one of memory units in parallel processor memory, such as memory units 1324A-1324N of FIG. 13A (e.g., within parallel processor memory 1322).

In at least one embodiment, ROP 1326 is a processing unit that performs raster operations such as stencil, z test, blending, etc. In at least one embodiment, ROP 1326 then outputs processed graphics data that is stored in graphics memory. In at least one embodiment, ROP 1326 includes compression logic to compress depth or color data that is written to memory and decompress depth or color data that is read from memory. In at least one embodiment, compression logic can be lossless compression logic that makes use of one or more of multiple compression algorithms. In at least one embodiment, a type of compression that is performed by ROP 1326 can vary based on statistical characteristics of data to be compressed. For example, in at least one embodiment, delta color compression is performed on depth and color data on a per-tile basis.

In at least one embodiment, ROP 1326 is included within each processing cluster (e.g., cluster 1314A-1314N of FIG. 13A) instead of within partition unit 1320. In at least one embodiment, read and write requests for pixel data are transmitted over memory crossbar 1316 instead of pixel fragment data. In at least one embodiment, processed graphics data may be displayed on a display device, such as one of one or more display device(s) 1510 of FIG. 15, routed for further processing by processor(s) 1302, or routed for further processing by one of processing entities within parallel processor 1300 of FIG. 13A.

Figure 14:
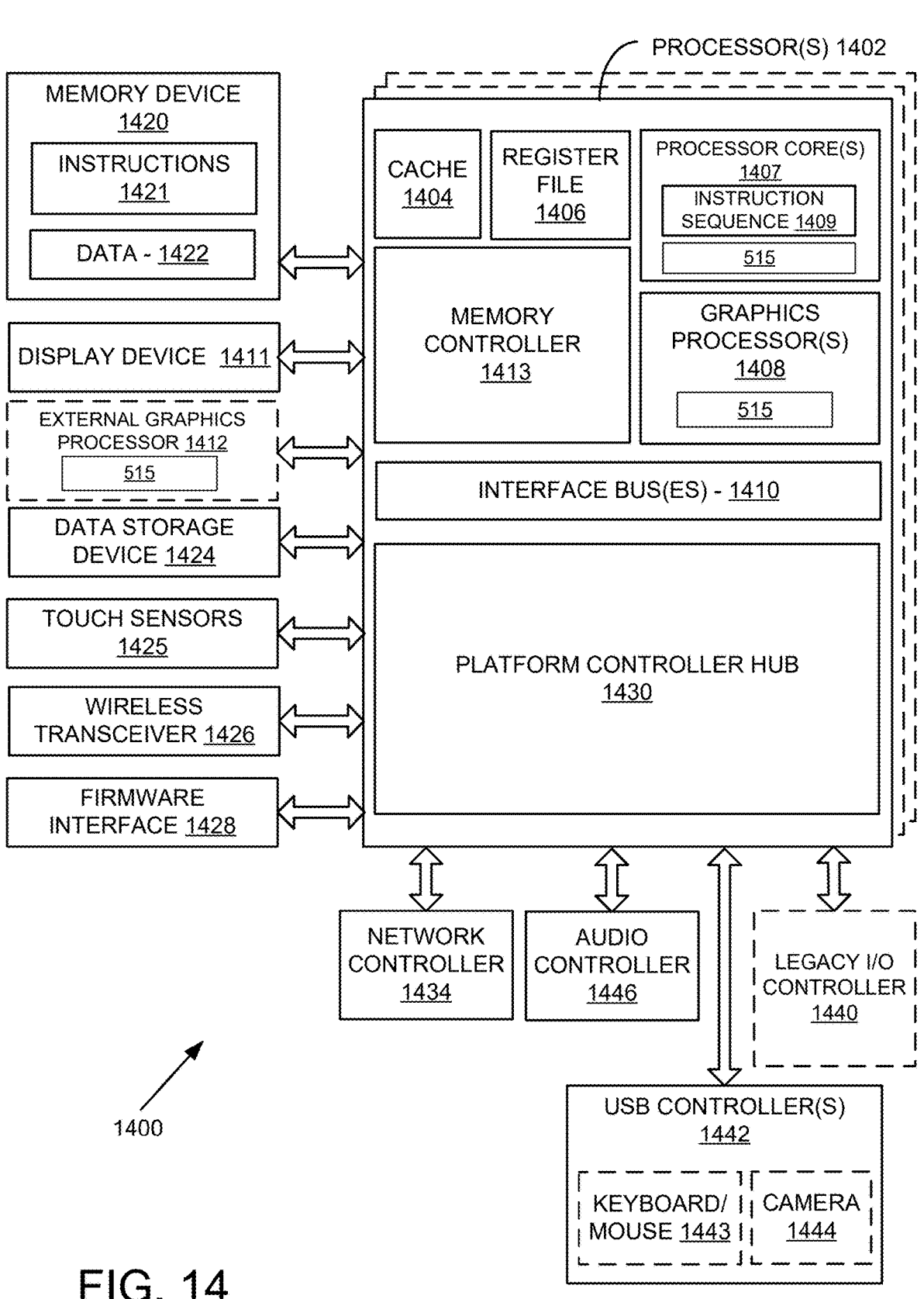
FIG. 14 illustrates at least portions of a graphics processor, according to one or more embodiments.

FIG. 14 is a block diagram of a processing system, according to at least one embodiment. In at least one embodiment, system 1400 includes one or more processor(s) 1402 and one or more graphics processor(s) 1408, and may be a single processor desktop system, a multiprocessor workstation system, or a server system having a large number of processor(s) 1402 or processor core(s) 1407. In at least one embodiment, system 1400 is a processing platform incorporated within a system-on-a-chip (SoC) integrated circuit for use in mobile, handheld, or embedded devices. In at least one embodiment, one or more graphics processor(s) 1408 include one or more graphics cores 1200.

In at least one embodiment, system 1400 can include, or be incorporated within a server-based gaming platform, a game console, including a game and media console, a mobile gaming console, a handheld game console, or an online game console. In at least one embodiment, system 1400 is a mobile phone, a smart phone, a tablet computing device or a mobile Internet device. In at least one embodiment, processing system 1400 can also include, couple with, or be integrated within a wearable device, such as a smart watch wearable device, a smart eyewear device, an augmented reality device, or a virtual reality device. In at least one embodiment, processing system 1400 is a television or set top box device having one or more processor(s) 1402 and a graphical interface generated by one or more graphics processor(s) 1408.

In at least one embodiment, one or more processor(s) 1402 each include one or more processor core(s) 1407 to process instructions which, when executed, perform operations for system and user software. In at least one embodiment, each of one or more processor core(s) 1407 is configured to process a specific instruction sequence 1409. In at least one embodiment, instruction sequence 1409 may facilitate Complex Instruction Set Computing (CISC), Reduced Instruction Set Computing (RISC), or computing via a Very Long Instruction Word (VLIW). In at least one embodiment, processor core(s) 1407 may each process a different instruction sequence 1409, which may include instructions to facilitate emulation of other instruction sequences. In at least one embodiment, processor core(s) 1407 may also include other processing devices, such a Digital Signal Processor (DSP).

In at least one embodiment, processor(s) 1402 includes a cache memory 1404. In at least one embodiment, processor(s) 1402 can have a single internal cache or multiple levels of internal cache. In at least one embodiment, cache memory is shared among various components of processor(s) 1402. In at least one embodiment, processor(s) 1402 also uses an external cache (e.g., a Level-3 (L3) cache or Last Level Cache (LLC)) (not shown), which may be shared among processor core(s) 1407 using known cache coherency techniques. In at least one embodiment, a register file 1406 is additionally included in processor(s) 1402, which may include different types of registers for storing different types of data (e.g., integer registers, floating point registers, status registers, and an instruction pointer register). In at least one embodiment, register file 1406 may include general-purpose registers or other registers.

In at least one embodiment, one or more processor(s) 1402 are coupled with one or more interface bus(es) 1410 to transmit communication signals such as address, data, or control signals between processor(s) 1402 and other components in system 1400. In at least one embodiment, interface bus(es) 1410 can be a processor bus, such as a version of a Direct Media Interface (DMI) bus. In at least one embodiment, interface bus(es) 1410 is not limited to a DMI bus, and may include one or more Peripheral Component Interconnect buses (e.g., PCI, PCI Express), memory busses, or other types of interface busses. In at least one embodiment processor(s) 1402 include an integrated memory controller 1416 and a platform controller hub 1430. In at least one embodiment, memory controller 1416 facilitates communication between a memory device and other components of system 1400, while platform controller hub (PCH) 1430 provides connections to I/O devices via a local I/O bus.

In at least one embodiment, a memory device 1420 can be a dynamic random access memory (DRAM) device, a static random access memory (SRAM) device, flash memory device, phase-change memory device, or some other memory device having suitable performance to serve as process memory. In at least one embodiment, memory device 1420 can operate as system memory for system 1400, to store data 1422 and instructions 1421 for use when one or more processor(s) 1402 executes an application or process. In at least one embodiment, memory controller 1416 also couples with an optional external graphics processor 1412, which may communicate with one or more graphics processor(s) 1408 in processor(s) 1402 to perform graphics and media operations. In at least one embodiment, a display device 1411 can connect to processor(s) 1402. In at least one embodiment, display device 1411 can include one or more of an internal display device, as in a mobile electronic device or a laptop device, or an external display device attached via a display interface (e.g., DisplayPort, etc.). In at least one embodiment, display device 1411 can include a head mounted display (HMD) such as a stereoscopic display device for use in virtual reality (VR) applications or augmented reality (AR) applications.

In at least one embodiment, platform controller hub 1430 enables peripherals to connect to memory device 1420 and processor(s) 1402 via a high-speed I/O bus. In at least one embodiment, I/O peripherals include, but are not limited to, an audio controller 1446, a network controller 1434, a firmware interface 1428, a wireless transceiver 1426, touch sensors 1425, a data storage device 1424 (e.g., hard disk drive, flash memory, etc.). In at least one embodiment, data storage device 1424 can connect via a storage interface (e.g., SATA) or via a peripheral bus, such as a Peripheral Component Interconnect bus (e.g., PCI, PCI Express). In at least one embodiment, touch sensors 1425 can include touch screen sensors, pressure sensors, or fingerprint sensors. In at least one embodiment, wireless transceiver 1426 can be a Wi-Fi transceiver, a Bluetooth transceiver, or a mobile network transceiver such as a 3G, 4G, or Long Term Evolution (LTE) transceiver. In at least one embodiment, firmware interface 1428 enables communication with system firmware, and can be, for example, a unified extensible firmware interface (UEFI). In at least one embodiment, network controller 1434 can enable a network connection to a wired network. In at least one embodiment, a high-performance network controller (not shown) couples with interface bus(es) 1410. In at least one embodiment, audio controller 1446 is a multi-channel high definition audio controller. In at least one embodiment, system 1400 includes an optional legacy I/O controller 1440 for coupling legacy (e.g., Personal System 2 (PS/2)) devices to system 1400. In at least one embodiment, platform controller hub 1430 can also connect to one or more Universal Serial Bus (USB) controller(s) 1442 connect input devices, such as keyboard and mouse 1443 combinations, a camera 1444, or other USB input devices.

In at least one embodiment, an instance of memory controller 1416 and platform controller hub 1430 may be integrated into a discreet external graphics processor, such as external graphics processor 1412. In at least one embodiment, platform controller hub 1430 and/or memory controller 1416 may be external to one or more processor(s) 1402. For example, in at least one embodiment, system 1400 can include an external memory controller 1416 and platform controller hub 1430, which may be configured as a memory controller hub and peripheral controller hub within a system chipset that is in communication with processor(s) 1402.

Embodiments presented herein can provide for the improvement in stability of an oscillator through use of an isolated chamber surrounding the oscillator.

Other variations are within spirit of present disclosure. Thus, while disclosed techniques are susceptible to various modifications and alternative constructions, certain illustrated embodiments thereof are shown in drawings and have been described above in detail. It should be understood, however, that there is no intention to limit disclosure to specific form or forms disclosed, but on contrary, intention is to cover all modifications, alternative constructions, and equivalents falling within spirit and scope of disclosure, as defined in appended claims.

Use of terms "a" and "an" and "the" and similar referents in context of describing disclosed embodiments (especially in context of following claims) are to be construed to cover both singular and plural, unless otherwise indicated herein or clearly contradicted by context, and not as a definition of a term. Terms "comprising," "having," "including," and "containing" are to be construed as open-ended terms (meaning "including, but not limited to,") unless otherwise noted. "Connected," when unmodified and referring to physical connections, is to be construed as partly or wholly contained within, attached to, or joined together, even if there is something intervening. Recitation of ranges of values herein are merely intended to serve as a shorthand method of referring individually to each separate value falling within range, unless otherwise indicated herein and each separate value is incorporated into specification as if it were individually recited herein. In at least one embodiment, use of term "set" (e.g., "a set of items") or "subset" unless otherwise noted or contradicted by context, is to be construed as a nonempty collection comprising one or more members. Further, unless otherwise noted or contradicted by context, term "subset" of a corresponding set does not necessarily denote a proper subset of corresponding set, but subset and corresponding set may be equal.

Conjunctive language, such as phrases of form "at least one of A, B, and C," or "at least one of A, B and C," unless specifically stated otherwise or otherwise clearly contradicted by context, is otherwise understood with context as used in general to present that an item, term, etc., may be either A or B or C, or any nonempty subset of set of A and B and C. For instance, in illustrative example of a set having three members, conjunctive phrases "at least one of A, B, and C" and "at least one of A, B and C" refer to any of following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present. In addition, unless otherwise noted or contradicted by context, term "plurality" indicates a state of being plural (e.g., "a plurality of items" indicates multiple items). In at least one embodiment, number of items in a plurality is at least two, but can be more when so indicated either explicitly or by context. Further, unless stated otherwise or otherwise clear from context, phrase "based on" means "based at least in part on" and not "based solely on."

Operations of processes described herein can be performed in any suitable order unless otherwise indicated herein or otherwise clearly contradicted by context. In at least one embodiment, a process such as those processes described herein (or variations and/or combinations thereof) is performed under control of one or more computer systems configured with executable instructions and is implemented as code (e.g., executable instructions, one or more computer programs or one or more applications) executing collectively on one or more processors, by hardware or combinations thereof. In at least one embodiment, code is stored on a computer-readable storage medium, for example, in form of a computer program comprising a plurality of instructions executable by one or more processors. In at least one embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In at least one embodiment, code (e.g., executable code or source code) is stored on a set of one or more non-transitory computer-readable storage media having stored thereon executable instructions (or other memory to store executable instructions) that, when executed (i.e., as a result of being executed) by one or more processors of a computer system, cause computer system to perform operations described herein. In at least one embodiment, set of non-transitory computer-readable storage media comprises multiple non-transitory computer-readable storage media and one or more of individual non-transitory storage media of multiple non-transitory computer-readable storage media lack all of code while multiple non-transitory computer-readable storage media collectively store all of code. In at least one embodiment, executable instructions are executed such that different instructions are executed by different processors—for example, a non-transitory computer-readable storage medium store instructions and a main central processing unit ("CPU") executes some of instructions while a graphics processing unit ("GPU") executes other instructions. In at least one embodiment, different components of a computer system have separate processors and different processors execute different subsets of instructions.

In at least one embodiment, an arithmetic logic unit is a set of combinational logic circuitry that takes one or more inputs to produce a result. In at least one embodiment, an arithmetic logic unit is used by a processor to implement mathematical operation such as addition, subtraction, or multiplication. In at least one embodiment, an arithmetic logic unit is used to implement logical operations such as logical AND/OR or XOR. In at least one embodiment, an arithmetic logic unit is stateless, and made from physical switching components such as semiconductor transistors arranged to form logical gates. In at least one embodiment, an arithmetic logic unit may operate internally as a stateful logic circuit with an associated clock. In at least one embodiment, an arithmetic logic unit may be constructed as an asynchronous logic circuit with an internal state not maintained in an associated register set. In at least one embodiment, an arithmetic logic unit is used by a processor to combine operands stored in one or more registers of the processor and produce an output that can be stored by the processor in another register or a memory location.

In at least one embodiment, as a result of processing an instruction retrieved by the processor, the processor presents one or more inputs or operands to an arithmetic logic unit, causing the arithmetic logic unit to produce a result based at least in part on an instruction code provided to inputs of the arithmetic logic unit. In at least one embodiment, the instruction codes provided by the processor to the ALU are based at least in part on the instruction executed by the processor. In at least one embodiment combinational logic in the ALU processes the inputs and produces an output which is placed on a bus within the processor. In at least one embodiment, the processor selects a destination register, memory location, output device, or output storage location on the output bus so that clocking the processor causes the results produced by the ALU to be sent to the desired location.

In the scope of this application, the term arithmetic logic unit, or ALU, is used to refer to any computational logic circuit that processes operands to produce a result. For example, in the present document, the term ALU can refer to a floating point unit, a DSP, a tensor core, a shader core, a coprocessor, or a CPU.

Accordingly, in at least one embodiment, computer systems are configured to implement one or more services that singly or collectively perform operations of processes described herein and such computer systems are configured with applicable hardware and/or software that enable performance of operations. Further, a computer system that implements at least one embodiment of present disclosure is a single device and, in another embodiment, is a distributed computer system comprising multiple devices that operate differently such that distributed computer system performs operations described herein and such that a single device does not perform all operations.

Use of any and all examples, or exemplary language (e.g., "such as") provided herein, is intended merely to better illuminate embodiments of disclosure and does not pose a limitation on scope of disclosure unless otherwise claimed. No language in specification should be construed as indicating any non-claimed element as essential to practice of disclosure.

All references, including publications, patent applications, and patents, cited herein are hereby incorporated by reference to same extent as if each reference were individually and specifically indicated to be incorporated by reference and were set forth in its entirety herein.

In description and claims, terms "coupled" and "connected," along with their derivatives, may be used. It should be understood that these terms may be not intended as synonyms for each other. Rather, in particular examples, "connected" or "coupled" may be used to indicate that two or more elements are in direct or indirect physical or electrical contact with each other. "Coupled" may also mean that two or more elements are not in direct contact with each other, but yet still co-operate or interact with each other.

Unless specifically stated otherwise, it may be appreciated that throughout specification terms such as "processing," "computing," "calculating," "determining," or like, refer to action and/or processes of a computer or computing system, or similar electronic computing device, that manipulate and/or transform data represented as physical, such as electronic, quantities within computing system's registers and/or memories into other data similarly represented as physical quantities within computing system's memories, registers or other such information storage, transmission or display devices.

In a similar manner, term "processor" may refer to any device or portion of a device that processes electronic data from registers and/or memory and transform that electronic data into other electronic data that may be stored in registers and/or memory. As non-limiting examples, "processor" may be a CPU or a GPU. A "computing platform" may comprise one or more processors. As used herein, "software" processes may include, for example, software and/or hardware entities that perform work over time, such as tasks, threads, and intelligent agents. Also, each process may refer to multiple processes, for carrying out instructions in sequence or in parallel, continuously or intermittently. In at least one embodiment, terms "system" and "method" are used herein interchangeably insofar as system may embody one or more methods and methods may be considered a system.

In present document, references may be made to obtaining, acquiring, receiving, or inputting analog or digital data into a subsystem, computer system, or computer-implemented machine. In at least one embodiment, process of obtaining, acquiring, receiving, or inputting analog and digital data can be accomplished in a variety of ways such as by receiving data as a parameter of a function call or a call to an application programming interface. In at least one embodiment, processes of obtaining, acquiring, receiving, or inputting analog or digital data can be accomplished by transferring data via a serial or parallel interface. In at least one embodiment, processes of obtaining, acquiring, receiving, or inputting analog or digital data can be accomplished by transferring data via a computer network from providing entity to acquiring entity. In at least one embodiment, references may also be made to providing, outputting, transmitting, sending, or presenting analog or digital data. In various examples, processes of providing, outputting, transmitting, sending, or presenting analog or digital data can be accomplished by transferring data as an input or output parameter of a function call, a parameter of an application programming interface or interprocess communication mechanism.

Although descriptions herein set forth example implementations of described techniques, other architectures may be used to implement described functionality, and are intended to be within scope of this disclosure. Furthermore, although specific distributions of responsibilities may be defined above for purposes of description, various functions and responsibilities might be distributed and divided in different ways, depending on circumstances.

Furthermore, although subject matter has been described in language specific to structural features and/or methodological acts, it is to be understood that subject matter claimed in appended claims is not necessarily limited to specific features or acts described. Rather, specific features and acts are disclosed as exemplary forms of implementing the claims.

What is claimed is:

1. A device, comprising:

an oscillator;

a sealed housing including an inner chamber in which the oscillator is contained;

a blocking layer positioned about an interior of the inner chamber and spaced from the oscillator to create a gap around the oscillator within the inner chamber; and a sealable channel extending from the gap to an exterior of the sealed housing to allow gas to be removed from the gap in order to create at least a partial vacuum around the oscillator.

2. The device of claim 1, wherein the blocking layer has an emissivity index of less than about 0.10 in order to reduce an amount of radiation incident on the oscillator during operation.

3. The device of claim 1, wherein the blocking layer is a metal layer comprised at least partially of copper, silver, gold, or aluminum.

4. The device of claim 1, wherein the oscillator is less than 10 mm in dimension, and wherein the gap around the oscillator is less than about 3 mm in width.

5. The device of claim 1, wherein the partial vacuum has a pressure of less than 10 PSIA.

6. The device of claim 1, wherein the sealable channel includes a uni-directional valve connectable to a vacuum pump to allow the gas to be removed from the gap prior to operation of the oscillator.

7. The device of claim 1, wherein the oscillator includes a plurality of pins extending to an exterior of the sealed housing to allow for operation of the oscillator, the plurality of pins further maintaining the position of the oscillator in the inner chamber.

8. The device of claim 1, further comprising:

one or more phase-locked loops (PLLs) to direct an output clock signal from the oscillator to one or more recipient destinations.

9. The device of claim 1, wherein the device is to be installed in a computing device to receive a clock signal generated by the oscillator, the computing device including at least one of a server, a switch, a router, or a network interface card.

10. A high stability oscillator, comprising:

a sealed housing including an inner chamber and a mechanism to allow gas to be removed from the inner chamber to create a region of at least partial vacuum; and an oscillator positioned in the region of at least partial vacuum, the oscillator having a plurality of pins passing through a wall of the sealed housing to allow for transmission of at least power and a clock signal.

11. The high stability oscillator of claim 10, further comprising:

a layer of blocking material positioned about an interior surface of the inner chamber, the blocking material having an emissivity index of less than about 0.10.

12. The high stability oscillator of claim 11, wherein the inner chamber includes walls of a plastic material, and wherein the layer of blocking material is comprised at least partially of copper, silver, gold, or aluminum.

13. The high stability oscillator of claim 10, wherein the oscillator is less than 10 mm in dimension, and wherein a width of the region of at least partial vacuum around the oscillator is less than about 3 mm in width.

14. The high stability oscillator of claim 10, wherein the at least partial vacuum has a pressure of less than 10 PSIA.

15. The high stability oscillator of claim 10, wherein the oscillator is a temperature-compensated crystal oscillator (TCXO), an oven controlled crystal oscillator (OCXO), or a microelectromechanical system (MEMS) oscillator.

16. A housing for an electronic component, comprising:

an inner chamber;

a low emissivity blocking material layer positioned about a surface of the inner chamber;

one or more passthroughs extending from the inner chamber to an exterior of the housing; and an inlet allowing gas to be removed from the inner chamber to produce a region of at least partial vacuum, wherein the electronic component is able to be placed in the inner chamber of the housing and at least partially surrounded by the region of at least partial vacuum, a set of pins of the electronic component to extend through the one or more passthroughs to allow for operation of the electronic component within the housing.

17. The housing of claim 16, wherein the electronic component is an oscillator with an operational frequency that is sensitive to temperature.

18. The housing of claim 16, wherein the low emissivity blocking material layer has an emissivity index of less than about 0.10 in order to reduce an amount of radiation incident on the electronic component during operation.

19. The housing of claim 16, further comprising:

at least one connector to rigidly mount the electronic component in the inner chamber to be at least partially surrounded by the region of at least partial vacuum.

20. The housing of claim 16, wherein the electronic component is comprised in at least one of:

a system for performing simulation operations;

a system for performing simulation operations to test or validate autonomous machine applications;

a system for performing digital twin operations;

a system for performing light transport simulation;

a system for rendering graphical output;

a system for performing deep learning operations;

a system for performing generative AI operations using a large language model (LLM);

a system implemented using an edge device;

a system for generating or presenting virtual reality (VR) content;

a system for generating or presenting augmented reality (AR) content;

a system for generating or presenting mixed reality (MR) content;

a system incorporating one or more Virtual Machines (VMs);

a system implemented at least partially in a data center;

a system for performing hardware testing using simulation;

a system for performing generative operations using a language model (LM);

a system for synthetic data generation;

a collaborative content creation platform for 3D assets; or a system implemented at least partially using cloud computing resources.

* * * * *